(12) United States Patent
Nasu et al.

(10) Patent No.: US 11,557,587 B2
(45) Date of Patent: Jan. 17, 2023

(54) SEMICONDUCTOR DEVICE AND SEMICONDUCTOR PACKAGE

(71) Applicant: ROHM CO., LTD., Kyoto (JP)

(72) Inventors: Kentaro Nasu, Kyoto (JP); Kenji Nishida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/874,347

(22) Filed: May 14, 2020

(65) Prior Publication Data

US 2020/0273858 A1    Aug. 27, 2020

Related U.S. Application Data

(63) Continuation of application No. 15/713,015, filed on Sep. 22, 2017, now Pat. No. 10,692,863.

(30) Foreign Application Priority Data

Sep. 30, 2016 (JP) .............................. JP2016-194316
Sep. 30, 2016 (JP) .............................. JP2016-194317
Aug. 22, 2017 (JP) .............................. JP2017-159596

(51) Int. Cl.
*H01L 27/08* (2006.01)
*H01L 27/088* (2006.01)
(Continued)

(52) U.S. Cl.
CPC ........ *H01L 27/088* (2013.01); *H01L 23/5226* (2013.01); *H01L 27/0207* (2013.01);
(Continued)

(58) Field of Classification Search
CPC .......................... H01L 29/4238; H01L 27/088
See application file for complete search history.

(56) References Cited

U.S. PATENT DOCUMENTS 5,488,236 A    1/1996   Baliga et al.
5,548,152 A    8/1996   Arai
(Continued)

FOREIGN PATENT DOCUMENTS

JP    H0832060      2/1996
JP    2005166796    6/2005
(Continued)

OTHER PUBLICATIONS

Office Action issued for Japanese Patent Application No. 2017-159596, Dispatch Date: Apr. 22, 2021, 10 pages Including English translation.
(Continued)

*Primary Examiner* — Sarah K Salerno
(74) *Attorney, Agent, or Firm* — Hamre, Schumann, Mueller & Larson, P.C.

(57) ABSTRACT

A semiconductor device includes an enhancement-mode first p-channel MISFET, an enhancement-mode second p-channel MISFET, a drain conductor electrically and commonly connected to the first p-channel MISFET and the second p-channel MISFET, a first source conductor electrically connected to a source of the first p-channel MISFET, a second source conductor electrically connected to a source of the second p-channel MISFET, and a gate conductor electrically and commonly connected to a gate of the first p-channel MISFET and a gate of the second p-channel MISFET.

14 Claims, 30 Drawing Sheets

(51) Int. Cl.
*H01L 23/522* (2006.01)
*H01L 27/02* (2006.01)
*H01L 29/78* (2006.01)
*H01L 29/06* (2006.01)
*H01L 29/423* (2006.01)
*H01L 27/06* (2006.01)
*H01L 29/08* (2006.01)
*H01L 29/417* (2006.01)
*H01L 29/49* (2006.01)
*H01L 23/495* (2006.01)
*H01L 21/8234* (2006.01)

(52) U.S. Cl.
CPC ...... *H01L 27/0255* (2013.01); *H01L 27/0629* (2013.01); *H01L 29/0696* (2013.01); *H01L 29/4236* (2013.01); *H01L 29/4238* (2013.01); *H01L 29/7802* (2013.01); *H01L 29/7813* (2013.01); *H01L 29/7817* (2013.01); *H01L 29/7827* (2013.01); *H01L 21/823475* (2013.01); *H01L 21/823487* (2013.01); *H01L 23/49562* (2013.01); *H01L 29/0619* (2013.01); *H01L 29/0869* (2013.01); *H01L 29/0878* (2013.01); *H01L 29/41741* (2013.01); *H01L 29/4933* (2013.01); *H01L 2224/0603* (2013.01); *H01L 2224/48091* (2013.01); *H01L 2224/49111* (2013.01)

(56) References Cited

U.S. PATENT DOCUMENTS

| | | | |
|---|---|---|---|
| 5,886,515 A | | 3/1999 | Kelly |
| 9,842,920 B1 * | | 12/2017 | Jeon .................. H01L 29/41758 |
| 11,133,377 B2 * | | 9/2021 | Nakano ................ H01L 29/063 |
| 2001/0045598 A1 | | 11/2001 | Korec et al. |
| 2003/0102494 A1 * | | 6/2003 | Akamine ............ H01L 27/0207 |
| | | | 257/202 |
| 2004/0070047 A1 | | 4/2004 | Majumdar et al. |
| 2006/0163561 A1 * | | 7/2006 | Setayesh ................ B82Y 10/00 |
| | | | 257/40 |
| 2006/0237786 A1 | | 10/2006 | Ninomiya et al. |
| 2010/0046263 A1 | | 2/2010 | Deboy |
| 2010/0291767 A1 | | 11/2010 | Miura |
| 2012/0235702 A1 * | | 9/2012 | Huang ............... G11C 16/0425 |
| | | | 324/762.01 |
| 2014/0103360 A1 * | | 4/2014 | Hikita .................. H01L 29/7787 |
| | | | 257/76 |
| 2015/0129958 A1 * | | 5/2015 | Nita ................ H01L 21/823475 |
| | | | 257/334 |
| 2015/0145025 A1 | | 5/2015 | Yoshida et al. |
| 2015/0179633 A1 | | 6/2015 | Mauder et al. |
| 2015/0325504 A1 | | 11/2015 | Ise |
| 2015/0372086 A1 | | 12/2015 | Fachmann et al. |
| 2016/0056144 A1 | | 2/2016 | Yao et al. |
| 2016/0126235 A1 | | 5/2016 | Nishimura |
| 2016/0284824 A1 * | | 9/2016 | Nagata ................ H01L 29/0696 |
| 2016/0379992 A1 | | 12/2016 | Nagao et al. |

FOREIGN PATENT DOCUMENTS

| | | |
|---|---|---|
| JP | 2006147700 | 6/2006 |
| JP | 2007235150 | 9/2007 |
| JP | 2009246014 | 10/2009 |
| JP | 2011166673 | 8/2011 |
| JP | 2012034101 | 2/2012 |
| JP | 2012154119 | 8/2012 |
| JP | 2014017701 | 1/2014 |
| JP | 2014123665 | 7/2014 |
| JP | 2015002197 | 1/2015 |
| JP | 2016086006 | 5/2016 |
| WO | 2015080162 | 6/2015 |
| WO | 2015114803 | 8/2015 |

OTHER PUBLICATIONS

Decision to Grant a Patent issued for Japanese Patent Application No. 2017-159596, Dispatch Date: Aug. 26, 2021, 6 pages including English translation.

* cited by examiner

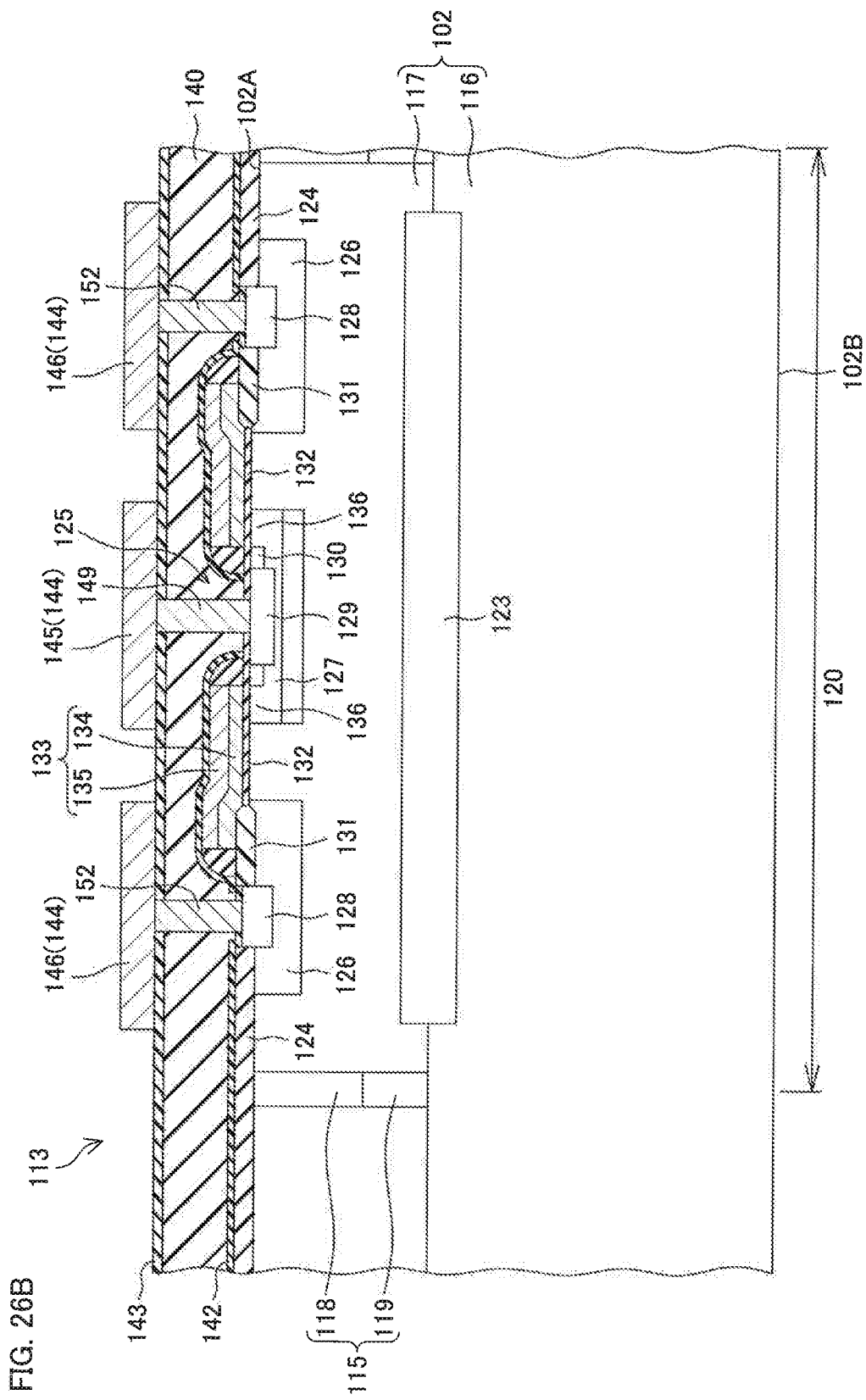

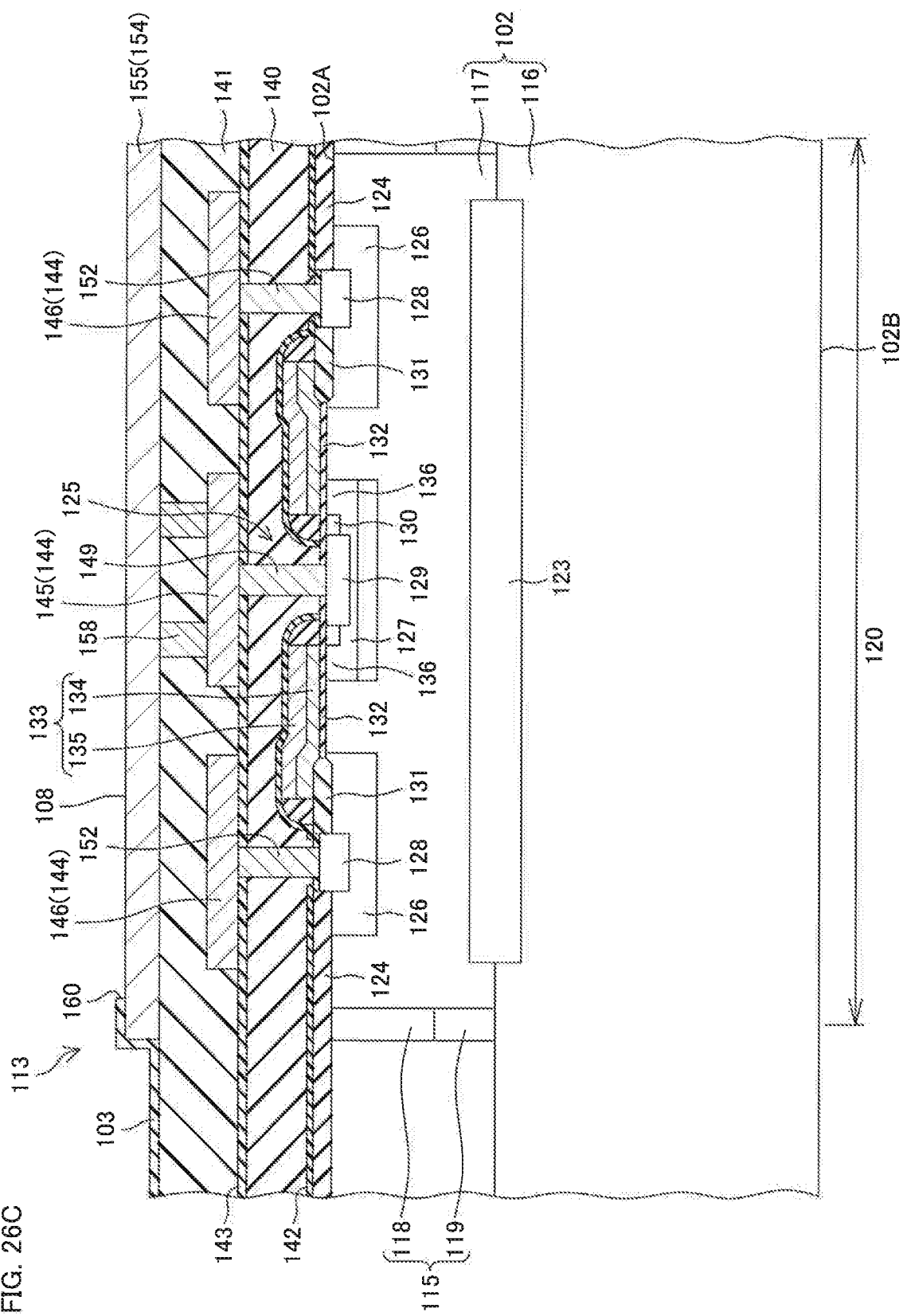

US 11,557,587 B2

SEMICONDUCTOR DEVICE AND SEMICONDUCTOR PACKAGE

CROSS-REFERENCE TO RELATED APPLICATIONS

The present application corresponds to Japanese Patent Application No. 2016-194316 filed in the Japan Patent Office on Sep. 30, 2016, Japanese Patent Application No. 2016-194317 filed in the Japan Patent Office on Sep. 30, 2016, and Japanese Patent Application No. 2017-159596 filed in the Japan Patent Office on Aug. 22, 2017, and the entire disclosure of these applications is incorporated herein by reference.

TECHNICAL FIELD

The present invention relates to a semiconductor device and a semiconductor package.

BACKGROUND ART

Conventionally, a junction gate field effect transistor (JFET) is known as a normally-on semiconductor element.

For example, Patent Document 1 (Japanese Patent Application Publication No. 2011-166673) discloses an SiC-JFET used in combination with a MOSFET.

For example, Patent Document 2 (Japanese Patent Application Publication No. 2014-123665) discloses a semiconductor package including a semiconductor chip, a stage on which the semiconductor chip is installed, a gate lead, a source lead, a drain lead, bonding wires, and a sealing resin.

SUMMARY OF INVENTION

An electric current flowing through a semiconductor layer is cut off by a depletion layer expanding in the semiconductor layer upon application of a voltage. By properly designing expansion width of the depletion layer, reliable cut off of the electric current is secured. Therefore, with the JFET, the expansion width of the depletion layer has to be preferentially taken into consideration and impurity concentration (channel concentration) of the semiconductor layer is lowered. As a result, resistance per unit length is relatively high. There is also a depletion-mode MOSFET as the normally-on semiconductor element. However, for the same reason that expansion width of a depletion layer is preferentially taken into consideration, a decrease in resistance of a semiconductor layer is prevented.

Under such a circumstance, in the JFET or the depletion MOSFET, in order to decrease on-resistance, there is a need for securing a large current pathway. Therefore, it is difficult to downsize the semiconductor element for use.

The object of the present invention is to provide a normally-on semiconductor device and a normally-on semiconductor package in which an element can be downsized.

Further, as in Patent Document 2, various semiconductor packages are conventionally proposed. However, in the future, in accordance with a demand for wearable terminals, more downsized transistors will be required.

Another object of the present invention is to provide a semiconductor device downsized much more than the conventional models.

BRIEF DESCRIPTION OF DRAWINGS

FIGS. 26A to 26F are cross-sectional views for illustrating one example of manufacturing processes of the semiconductor device of FIG. 1 in the order of the processes.

DESCRIPTION OF EMBODIMENTS

Figure 1:
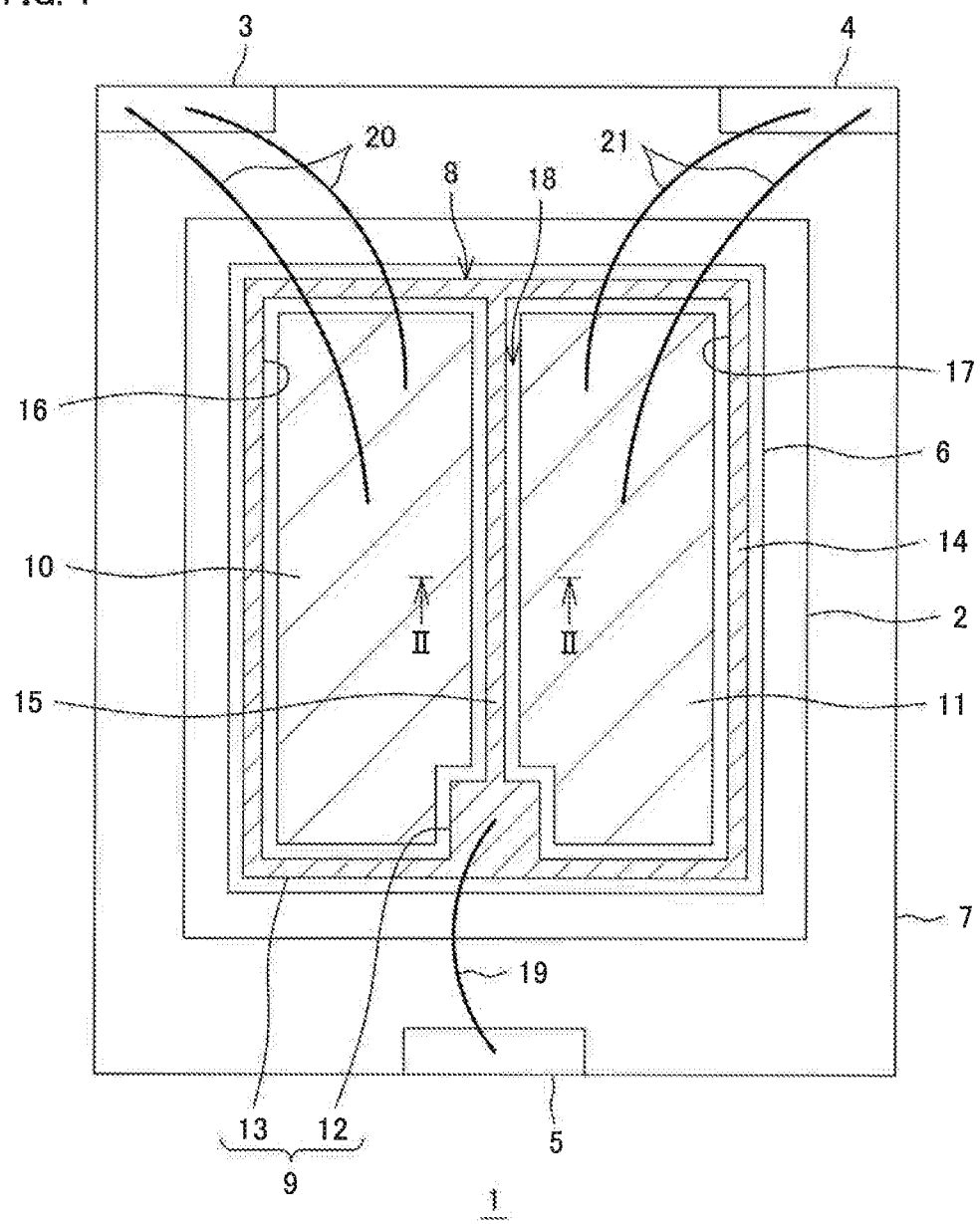
FIG. 1 is a schematic configuration diagram of a semiconductor package according to one preferred embodiment of the present invention.

A semiconductor device includes an enhancement-mode first p-channel MISFET, an enhancement-mode second p-channel MISFET, a drain conductor electrically and commonly connected to the first p-channel MISFET and the second p-channel MISFET, a first source conductor electrically connected to a source of the first p-channel MISFET, a second source conductor electrically connected to a source of the second p-channel MISFET, and a gate conductor electrically and commonly connected to a gate of the first p-channel MISFET and a gate of the second p-channel MISFET.

In the semiconductor device, when a voltage is applied between the first source conductor $S_1$ and the second source conductor $S_2$ (between $S_1$ and $S_2$) in a state where no voltage is applied to the gate conductor G, both the MISFETs are turned on via respective parasitic diodes (internal diodes) of the first p-channel MISFET and the second p-channel MISFET. Thereby, an electric current can flow between $S_1$ and $S_2$. Meanwhile, when a positive voltage is applied to the gate conductor G, a potential difference $VGS_1$ between the gate conductor G and the first source conductor $S_1$ comes close to zero, and at the end, the electric current is cut off between the first source conductor $S_1$ and the second source conductor $S_2$. In such a way, electrical conduction is formed between $S_1$ and $S_2$ when no voltage is applied to gate conductor G, whereas the electric current is cut off between $S_1$ and $S_2$ when the voltage is applied to the gate conductor G. That is, a normally-on action is realized. Further, in the first and second p-channel MISFETs in which the electric current is turned on/off in the semiconductor device, unlike a JFET or a depletion-mode MISFET, expansion of a depletion layer is not used for turning on/off the electric current. Therefore, impurity concentration of a semiconductor layer does not have to be designed in consideration of the depletion layer. Thus, even when the MISFETs are downsized, a low resistance value can be maintained.

The semiconductor device according to one preferred embodiment of the present invention may further include a semiconductor layer having a common p type drain region for the first p-channel MISFET and the second p-channel MISFET, wherein the first p-channel MISFET may include a first n type body region formed on a surface portion of the semiconductor layer, a first p type source region formed on a surface portion of the first n type body region, and a first gate electrode facing the first n type body region, the second p-channel MISFET may include a second n type body region formed on the surface portion of the semiconductor layer, a second p type source region formed on a surface portion of the second n type body region, and a second gate electrode facing the second n type body region, the drain conductor may include a drain electrode formed on a back surface of the semiconductor layer and connected to the p type drain region, the first source conductor may include a first source electrode connected to the first p type source region, the second source conductor may include a second source electrode arranged separately from the first source electrode and connected to the second p type source region, and the gate conductor may include gate wiring commonly connected to the first gate electrode and the second gate electrode in the semiconductor layer.

With this configuration, the first p-channel MISFET and the second p-channel MISFET can be integrated into one chip. Thus, a smaller semiconductor device can be provided.

In the semiconductor device according to one preferred embodiment of the present invention, the semiconductor layer may include a first active region for the first p-channel MISFET, and a second active region for the second p-channel MISFET arranged adjacent to the first active region, and the gate wiring may be provided in a region between the first active region and the second active region.

The semiconductor device according to one preferred embodiment of the present invention may further include a first gate trench formed beneath the first active region, a second gate trench formed beneath the second active region, and a third gate trench formed between the first gate trench and the second gate trench, the third gate trench commonly connecting the first gate trench and the second gate trench, wherein the first gate electrode may include an electrode embedded into the first gate trench, the second gate electrode may include an electrode embedded into the second gate trench, and the gate wiring may include an electrode embedded into the third gate trench.

The semiconductor device according to one preferred embodiment of the present invention may further include a first gate trench formed beneath the first active region, and a second gate trench formed beneath the second active region, wherein the first gate electrode may include an electrode embedded into the first gate trench, the second gate electrode may include an electrode embedded into the second gate trench, and the gate wiring may include an electrode formed in a region on the semiconductor layer and connected respectively to the first gate electrode and the second gate electrode from the upper side while stretching over the first gate electrode and the second gate electrode along a surface of the semiconductor layer.

In the semiconductor device according to one preferred embodiment of the present invention, in the region between the first active region and the second active region, the common p type drain region may occupy a region on the back surface side of the semiconductor layer rather than a surface portion of the semiconductor layer.

In the semiconductor device according to one preferred embodiment of the present invention, the gate wiring may include a single gate pad, and a gate finger connected to a gate pad, the gate finger surrounding the first active region and the second active region, and the first source electrode and the second source electrode may be arranged in regions separated from each other by the gate finger.

The semiconductor device according to one preferred embodiment of the present invention may further include a linear first unit cell row formed by a plurality of first unit cells of the first p-channel MISFET, and a linear second unit cell row formed by a plurality of second unit cells of the second p-channel MISFET, wherein the first unit cell row and the second unit cell row may be spaced from each other and alternately arranged, the first source electrode may have a base end portion on the one end side of the first unit cell row and the second unit cell row, and is formed into a comb shape in which a tooth portion is formed on each of the first unit cells, and the second source electrode may have a base end portion on the other end side of the first unit cell row and the second unit cell row, and is formed into a comb shape in which a tooth portion is formed on each of the second unit cells so that the second source electrode is engaged with the comb shaped first source electrode while being spaced from each other.

In the semiconductor device according to one preferred embodiment of the present invention, the plurality of first unit cells of the first p-channel MISFET and the plurality of second unit cells of the second p-channel MISFET may be arranged in a matrix as a whole, and the plurality of first unit cells and the plurality of second unit cells may be alternately arranged respectively in the row direction and the column direction.

A semiconductor package according to one preferred embodiment of the present invention includes the semiconductor device according to one preferred embodiment of the present invention, and a sealing resin that seals the whole or part of the semiconductor device.

With this configuration, the semiconductor device according to one preferred embodiment is provided. Thus, a normally-on semiconductor package in which an element can be downsized can be provided.

A semiconductor device according to one preferred embodiment of the present invention includes a semiconductor substrate of a square shape in a plan view having a surface, a back surface on the opposite side of the surface, and side surfaces between the surface and the back surface, a surface insulation film formed on the semiconductor substrate so as to cover at least the surface, a first pad arranged in a central portion of a first peripheral edge portion along one of the side surfaces of the semiconductor substrate on the surface side of the semiconductor substrate and spaced from both end corner portions of the first peripheral edge portion, a second pad arranged in one end corner portion of a second peripheral edge portion facing the first peripheral edge portion of the semiconductor substrate, and a third pad arranged in the other end corner portion of the second peripheral edge portion of the semiconductor substrate.

As a comparative mode which is different from this configuration, when a first pad is arranged in a corner portion of a first peripheral edge portion or the first pad is formed at such a size that the first pad reaches both end corner portions, a distance between the first pad and a second pad and a distance between the first pad and a third pad are respectively substantially equal to length of sides alongside surfaces of a semiconductor substrate. In such a mode, when size of the semiconductor substrate (length of the sides of the semiconductor substrate) is reduced in accordance with downsizing of a semiconductor device, the distances between pads are shortened, and there is a concern that a short circuit is formed after installation.

Meanwhile, with the configuration of the present invention, the first pad is arranged in the central portion of the first peripheral edge portion of the semiconductor substrate of a square shape in a plan view and spaced from both the end corner portions of the first peripheral edge portion. Therefore, a distance between the first pad and the second pad and a distance between the first pad and the third pad can be relatively extended. Therefore, while avoiding a short circuit at the time of installation, size of the semiconductor substrate can be reduced more than the above comparative mode. Thereby, the downsized semiconductor device can be provided.

In the semiconductor device according to one preferred embodiment of the present invention, the semiconductor substrate may include a semiconductor substrate of a rectangular shape in a plan view, and the first peripheral edge portion and the second peripheral edge portion may include peripheral edge portions along the longitudinal direction of the semiconductor substrate.

With this configuration, the second pad and the third pad are arranged in the one end corner portion and the other end corner portion of the second peripheral edge portion along the longitudinal direction. Thus, the distance between the second pad and the third pad can be relatively extended.

In the semiconductor device according to one preferred embodiment of the present invention, providing that a first arc with a top of the one end corner portion of the second peripheral edge portion as a center and with length of a short side of the semiconductor substrate as a radius, and a second arc with a top of the other end corner portion of the second peripheral edge portion as a center and with the length of the short side of the semiconductor substrate as a radius are formed on the surface of the semiconductor substrate, the first pad may be arranged in a region on the outer side of the first arc and in a region on the outer side of the second arc.

With this configuration, as the distance between the first pad and the second pad and the distance between the first pad and the third pad, at least length corresponding to a difference between the length of the short side of the semiconductor device and size (width) of the second pad and the third pad can be secured. That is, while maintaining the distance between the first pad and the second pad and the distance between the first pad and the third pad, the semiconductor device can be downsized for size of the first pad.

In the semiconductor device according to one preferred embodiment of the present invention, the first arc and the second arc may have such size that the arcs cross each other on the semiconductor substrate, and the first pad may be formed into a triangle having a pair of tangent lines running from an intersection point between the first arc and the second arc respectively to the first arc and the second arc, the tangent lines serving as two sides of the triangle.

With this configuration, the first pad can be formed by utilizing a space in the region on the outer side of the first arc and the second arc to a maximum extent. Thereby, while downsizing the semiconductor device, a sufficient bonding area for the first pad can be secured.

In the semiconductor device according to one preferred embodiment of the present invention, the second pad may be formed into a fan shape concentric to the first arc.

With this configuration, while securing at least length corresponding to a difference between the length of the short side of the semiconductor device and the size (width) of the second pad as the distance between the first pad and the second pad, a sufficient bonding area for the second pad can be secured.

In the semiconductor device according to one preferred embodiment of the present invention, the third pad may be formed into a fan shape concentric to the second arc.

With this configuration, while securing at least length corresponding to a difference between the length of the short side of the semiconductor device and the size (width) of the third pad, a sufficient bonding area for the third pad can be secured.

The semiconductor device according to one preferred embodiment of the present invention may include an MIS transistor structure formed in the semiconductor substrate the first pad may include a drain pad electrically connected to a drain of the MIS transistor structure, the second pad may include a source pad electrically connected to a source of the MIS transistor structure, and the third pad may include a gate pad electrically connected to a gate of the MIS transistor structure.

In the semiconductor device according to one preferred embodiment of the present invention, the semiconductor substrate may include an active region where the MIS transistor structure is formed, the MIS transistor structure may include a plurality of source regions and drain regions alternately arranged and formed into a stripe shape extending in the direction running from the first peripheral edge portion to the second peripheral edge portion, and the semiconductor device further may include a first interlayer film formed on the semiconductor substrate to cover the source regions and the drain regions, a first source wiring layer formed on the first interlayer film to cover a substantially half region of the active region on the side of the second peripheral edge portion and electrically connected to the source region in an end portion of the source regions on the side of the second peripheral edge portion, and a first drain wiring layer formed on the first interlayer film to cover a substantially half region of the active region on the side of the first peripheral edge portion and electrically connected to the drain region in an end portion of the drain regions on the side of the first peripheral edge portion.

With this configuration, each of the first source wiring layer and the first drain wiring layer is formed at such a size that substantially the half region of the active region is covered. Thereby, a large current pathway between the source and the drain can be secured. Therefore, while downsizing the semiconductor device, an increase in on-resistance of the MIS transistor can be suppressed.

The semiconductor device according to one preferred embodiment of the present invention, further may include a second interlayer film formed on the first interlayer film to cover the first source wiring layer and the first drain wiring layer, a second source wiring layer formed on the second interlayer film to cover substantially the half region of the active region on the side of the second peripheral edge portion and electrically connected to the first source wiring layer, part of the second source wiring layer being exposed from the surface insulation film as the source pad, and a second drain wiring layer formed on the second interlayer film to cover substantially the half region of the active region on the side of the first peripheral edge portion and electrically connected to the first drain wiring layer, part of the second drain wiring layer being exposed from the surface insulation film as the drain pad.

With this configuration, each of the second source wiring layer and the second drain wiring layer is formed at such a size that substantially the half region of the active region is covered. Thereby, a large current pathway between the source and the drain can be secured. Therefore, while downsizing the semiconductor device, the increase in the on-resistance of the MIS transistor can be suppressed.

The semiconductor device according to one preferred embodiment of the present invention, the semiconductor substrate further may include a protection diode region out of the active region, and a gate wiring layer formed on the second interlayer film to cover the protection diode region, part of the gate wiring layer being exposed from the surface insulation film as the gate pad.

In the semiconductor device according to one preferred embodiment of the present invention, the surface insulation film may be formed to cover the side surfaces of the semiconductor substrate.

With this configuration, in a case where the semiconductor devices are highly densely packed, a short circuit with an adjacent semiconductor package can be suppressed.

The semiconductor device according to one preferred embodiment of the present invention may have a chip size package structure.

In the semiconductor device according to one preferred embodiment of the present invention, the chip size package structure may include a long side of less than 0.50 mm, and a short side of less than 0.40 mm.

With this configuration, it is possible to provide the smallest semiconductor device conceived up to the present time.

In the semiconductor device according to one preferred embodiment of the present invention, the chip size package structure may be formed with a thickness of less than 0.15 mm.

With the thickness of the chip size package structure within the above range, even when the semiconductor device is installed but inclined, a projecting amount of a side surface of the semiconductor device from a normal position can be reduced. Thereby, even in a case where the semiconductor devices are highly densely packed, contact with an adjacent semiconductor device can be suppressed.

In the semiconductor device according to one preferred embodiment of the present invention, a distance between the first pad, the second pad, and/or the third pad may be 50% or more of the short side of the semiconductor substrate.

Hereinafter, embodiments of the present invention will be described in detail with reference to the accompanying drawings.

FIG. 1 is a schematic configuration diagram of a semiconductor package 1 according to one preferred embodiment of the present invention, showing an internal structure of the semiconductor package 1 in a plan view. FIG. 1 transparently shows the interior of the semiconductor package 1 for convenience.

The semiconductor package 1 is formed into a rectangular parallelepiped, and has size of, for example, 1.6 mm×1.6 mm or less. The semiconductor package 1 includes an island 2, a plurality of terminals 3 to 5, a semiconductor chip 6, and a sealing resin 7.

The island 2 is formed into a square shape in a plan view, and arranged in substantial center of the semiconductor package 1. In the preferred embodiment, the island 2 is connected to a drain electrode 53 to be described later. In a case where the semiconductor package 1 is used with a circuit configuration shown in FIG. 4B, the island 2 may also serve as a drain terminal of the semiconductor package 1.

The plurality of terminals 3 to 5 include a first source terminal 3, a second source terminal 4, and a gate terminal 5. The plurality of terminals 3 to 5 are provided only on one end among two ends of the thickness direction of the semiconductor package 1 (direction passing through the paper plane). The plurality of terminals 3 to 5 are arranged on the one end side while being apart from each other. In the preferred embodiment, the first source terminal 3 and the second source terminal 4 are respectively arranged at different ends on one side of a pair of facing sides of the semiconductor package 1 (corner portions of the semiconductor package 1). The gate terminal 5 is arranged in a substantially central portion on the other side of the facing sides.

The semiconductor chip 6 is formed into a square shape in a plan view and arranged on the island 2. The semiconductor chip 6 has an electrode film 8 formed with a predetermined pattern on a surface on the opposite side of a surface bonded to the island 2. The electrode film 8 includes gate wiring 9, first source wiring 10, and second source wiring 11.

The gate wiring 9 includes a gate pad 12, and a gate finger 13 extending from the gate pad 12.

The gate pad 12 is arranged in a substantially central portion on a side of the semiconductor chip 6 adjacent to the side of the semiconductor package 1 where the gate terminal 5 is arranged. By this arrangement mode, a distance between the gate pad 12 and the gate terminal 5 is shortened. Thus, connection by a bonding wire 19 is more easily performed.

The gate finger 13 includes an outer peripheral portion 14 provided along a peripheral edge portion of the semiconductor chip 6, the peripheral portion partitioning a closed region in a central region of the semiconductor chip 6 inside, and a central portion 15 extending from the gate pad 12 to the outer peripheral portion 14 provided on a side facing the gate pad so as to divide the outer peripheral portion 14 into two. The closed region inside the outer peripheral portion 14 is partitioned into a first region 16 and a second region 17 by the central portion 15. The first region 16 and the second region 17 are respectively formed on the side of the first source terminal 3 and on the side of the second source terminal 4 with the central portion 15 as a border, and have a substantially rectangular shape elongated in the direction along the central portion 15 from the source terminals 3, 4.

The first source wiring 10 and the second source wiring 11 are respectively arranged in the first region 16 and the second region 17 partitioned by the gate finger 13. A clearance 18 of fixed width is provided between the first and second source wirings 10, 11 and the gate finger 13, and these are separated and insulated by the clearance 18. The first source wiring 10 and the second source wiring 11 respectively have a substantially rectangular shape elongated in the direction along the central portion 15 from the source terminals 3, 4 as well as the first region 16 and the second region 17. By this shape, a plurality of bonding wires 20 on the side of the first source terminal 3 and a plurality of bonding wires 21 on the side of the second source terminal 4 can be connected without contact between the bonding wires.

The sealing resin 7 forms an outer form of the semiconductor package 1, and seals the semiconductor chip 6 so that at least part of the first source terminal 3, the second source terminal 4, and the gate terminal 5 is exposed. In a case where the semiconductor package 1 is used with the circuit configuration shown in FIG. 4B, the island 2 may be exposed as a drain terminal from a back surface of the sealing resin 7.

Figure 2:
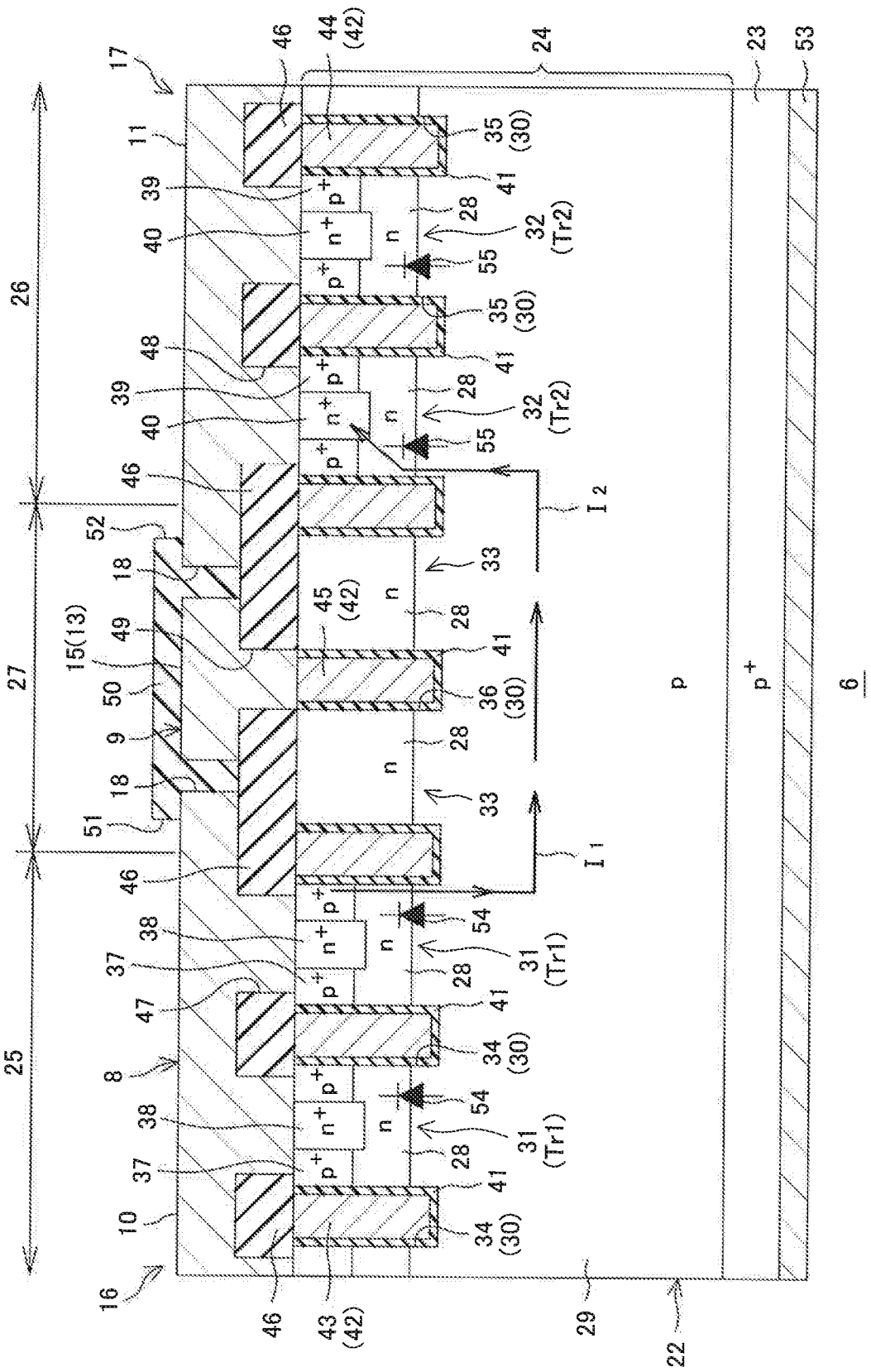
FIG. 2 is a cross-sectional view of a semiconductor chip of FIG. 1 taken along line II-II.
Figure 3:
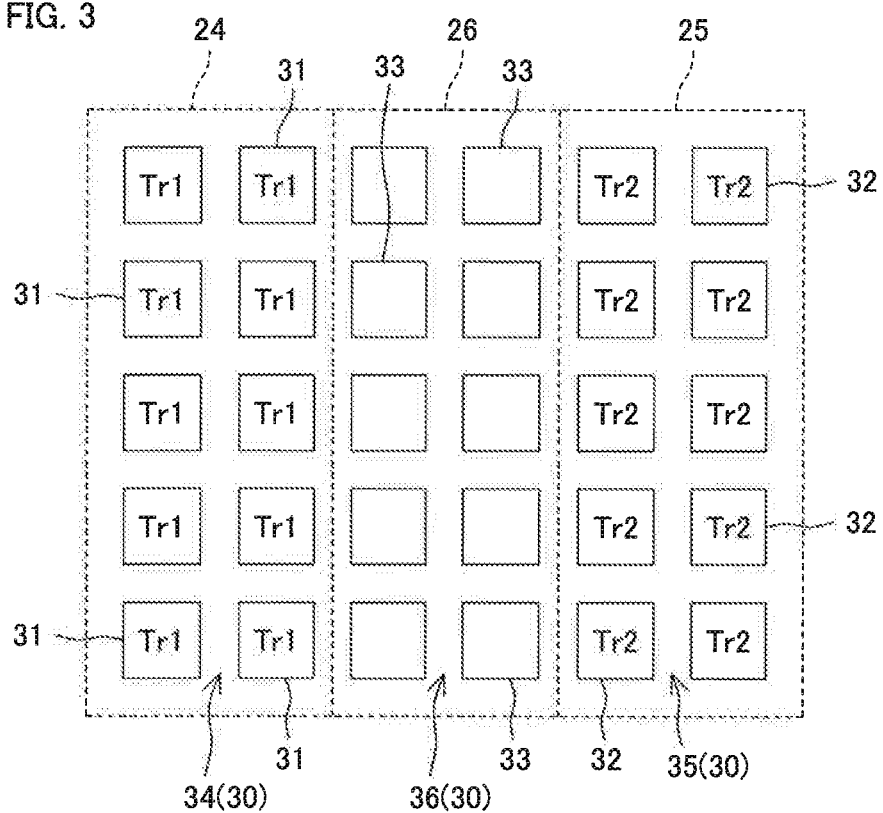
FIG. 3 is a view showing a cell layout of first transistors and second transistors.

FIG. 2 is a cross-sectional view of the semiconductor chip 6 of FIG. 1 taken along line II-II. FIG. 3 is a view showing a cell layout of first transistors Tr1 and second transistors Tr2.

The semiconductor chip 6 includes a semiconductor layer 22. The semiconductor layer 22 has a p+ type semiconductor substrate 23, and a p type epitaxial layer 24 laminated on the substrate 23. The semiconductor layer 22 may have no epitaxial layer but may be formed, for example, only of a p type semiconductor substrate.

A region on the semiconductor layer 22 includes first and second active regions 25 and 26 adjacent to each other, and a central region 27 is set between these regions 25, 26.

In a surface portion of the semiconductor layer 22 (p type epitaxial layer 24), an n type body region 28 is formed over the entire region of the first active region 25, the second active region 26, and the central region 27. In the p type epitaxial layer 24, a region on the back surface side of the semiconductor layer 22 with respect to the n type body region 28 is a p type drain region 29.

In the p type epitaxial layer 24, a gate trench 30 passing through the n type body region 28 from a surface of the p type epitaxial layer and reaching the p type drain region 29 is formed.

As shown in FIG. 3, the gate trench 30 is formed into a grid in a plan view as a whole while extending over borders between the first active region 25, the second active region 26, and the central region 27. Thereby, in the surface portion of the p type epitaxial layer 24, a plurality of unit cells 31 to 33 are partitioned into a plurality of window portions of the grid gate trench 30. The unit cells 31 to 33 include first unit cells 31 for first transistors Tr1 formed in the first active region 25, second unit cells 32 for second transistors Tr2 formed in the second active region 26, and third unit cells 33 (dummy cells) formed in the central region 27, the third unit cells having no function as transistors. That is, in the preferred embodiment, in the semiconductor layer 22, the plurality of first unit cells 31 and the plurality of second unit cells 32 are respectively integrated into the fixed regions (of the first active region 25 and the second active region 26), and arranged in a matrix in the regions 25, 26.

As shown in FIG. 3, the gate trench 30 can be divided into a first gate trench 34 beneath the first active region 25, a second gate trench 35 beneath the second active region 26, and a third gate trench 36 beneath the central region 27. The first gate trench 34 and the second gate trench 35 are commonly connected by the third gate trench 36 between these trenches 34, 35, and connected to each other via the third gate trench 36.

In each of the first unit cells 31, a p+ type source region 37 is formed in a surface portion of the n type body region 28. An n+ type body contact region 38 passing through the p+ type source region 37 from the surface of the p type epitaxial layer 24 and reaching the n type body region 28 is also formed. Thereby, the n type body region 28 can be contacted from the surface side of the p type epitaxial layer 24.

In each of the second unit cells 32, a p+ type source region 39 is formed in a surface portion of the n type body region 28. An n+ type body contact region 40 passing through the p+ type source region 39 from the surface of the p type epitaxial layer 24 and reaching the n type body region 28 is also formed. Thereby, the n type body region 28 can be contacted from the surface side of the p type epitaxial layer 24.

In each of the third unit cells 33, no source regions, etc., are formed in a surface portion thereof. Then type body region 28 occupies the third unit cells from a bottom portion of the gate trench 30 to the opening end.

Agate electrode 42 is embedded into the gate trench 30 via a gate insulation film 41. As shown in FIG. 2, the gate electrode 42 can be divided into a first gate electrode 43 embedded into the first gate trench 34, a second gate electrode 44 embedded into the second gate trench 35, and a third gate electrode 45 embedded into the third gate trench 36. The first gate electrode 43 and the second gate electrode 44 are commonly connected by the third gate electrode 45 between these electrodes 43, 44.

The first gate electrode 43 faces the p+ type source region 37 of each of the first unit cells 31, the n type body region 28, and the p type drain region 29. Thereby, in each of the first unit cells 31, the first transistor Tr1 serving as a p-channel MISFET is formed. In the first unit cell 31, a parasitic diode (first parasitic diode 54) formed by p-n junction between the p type drain region 29 and the n type body region 28 is provided.

The second gate electrode 44 faces the p+ type source region 39 of each of the second unit cells 32, the n type body region 28, and the p type drain region 29. Thereby, in each of the second unit cells 32, the second transistor Tr2 serving as a p-channel MISFET is formed. In the second unit cell 32, a parasitic diode (first parasitic diode 55) formed by p-n junction between the p type drain region 29 and the n type body region 28 is provided.

The third gate electrode 45 faces the n type body region 28 of each of the third unit cells 33.

An interlayer insulation film 46 is formed on the semiconductor layer 22. In the interlayer insulation film 46, a first contact hole 47, a second contact hole 48, and a third contact hole 49 are formed. The first contact hole 47 is to expose the p+ type source region 37 and the n+ type body contact region 38 of the first unit cells 31. The second contact hole 48 is to expose the p+ type source region 39 and the n+ type body contact region 40 of the second unit cells 32. The third contact hole 49 is to expose the third gate electrode 45.

The electrode film 8 shown in FIG. 1 is formed on the interlayer insulation film 46. The first source wiring 10 of the electrode film 8 is connected to the p+ type source region 37 and the n+ type body contact region 38 of the first unit cells 31 via the first contact hole 47. The second source wiring 11 is connected to the p+ type source region 39 and the n+ type body contact region 40 of the second unit cells 32 via the second contact hole 48. The gate finger 13 (central portion 15 in FIG. 2) is connected to the third gate electrode 45 via the third contact hole 49.

A surface protection film 50 is formed on the electrode film 8 so as to cover the electrode film 8. Pad openings 51, 52 to expose part of the first source wiring 10 and the second source wiring 11 as pads are formed in the surface protection film 50. Meanwhile, the gate finger 13 is covered by the surface protection film 50.

The drain electrode 53 is formed on the entire back surface of the semiconductor layer 22 (p+ type semiconductor substrate 23). The drain electrode 53 is a common electrode for the first transistors Tr1 and the second transistors Tr2.

Regarding the configuration of the semiconductor chip 6, the following description will be added.

The p+ type semiconductor substrate 23 is formed by, for example, a p type silicon substrate. Thickness of the p+ type semiconductor substrate 23 is, for example, 40 μm to 250 μm. The p+ type semiconductor substrate 23 contains, for example, boron (B), etc., as p type impurities, and concentration of the p type impurities is about $1\times10^{21}$ cm$^{-3}$ to $1\times10^{22}$ cm$^{-3}$.

Thickness of the p type epitaxial layer 24 is, for example, about 3 μm to 8 μm. The p type epitaxial layer 24 contains, for example, boron (B), etc., asp type impurities, and concentration of the p type impurities is about $1\times10^{16}$ cm$^{-3}$ to $1\times10^{17}$ cm$^{-3}$.

The n type body region 28 contains, for example, phosphorus (P), arsenic (As), etc., as n type impurities, and concentration of the n type impurities is about $2\times10^{16}$ cm$^{-3}$ to $3\times10^{17}$ cm$^{-3}$.

The p type drain region 29 contains, for example, boron (B), etc., as p type impurities, and concentration of the p type impurities is about $1\times10^{16}$ cm$^{-3}$ to $1\times10^{17}$ cm$^{-3}$.

The p+ type source regions 37, 39 contain, for example, boron (B), etc., as p type impurities, and concentration of the p type impurities is about $1\times10^{21}$ cm$^{-3}$ to $5\times10^{21}$ cm$^{-3}$.

The n+ type body contact regions 38, 40 contain, for example, phosphorus (P), arsenic (As), etc., as n type impurities, and concentration of the n type impurities is about $1\times10^{21}$ cm$^{-3}$ to $5\times10^{21}$ cm$^{-3}$.

The gate insulation film 41 is made of, for example, oxide silicon (SiO$_2$), and the gate electrode 42 is made of, for example, polysilicon (doped polysilicon).

The interlayer insulation film 46 is made of, for example, oxide silicon (SiO$_2$), and the surface protection film 50 is made of, for example, silicon nitride (SiN).

The gate wiring 9, the first source wiring 10, the second source wiring 11, and the drain electrode 53 are made of, for example, Al or an alloy containing Al.

Figure 4A:
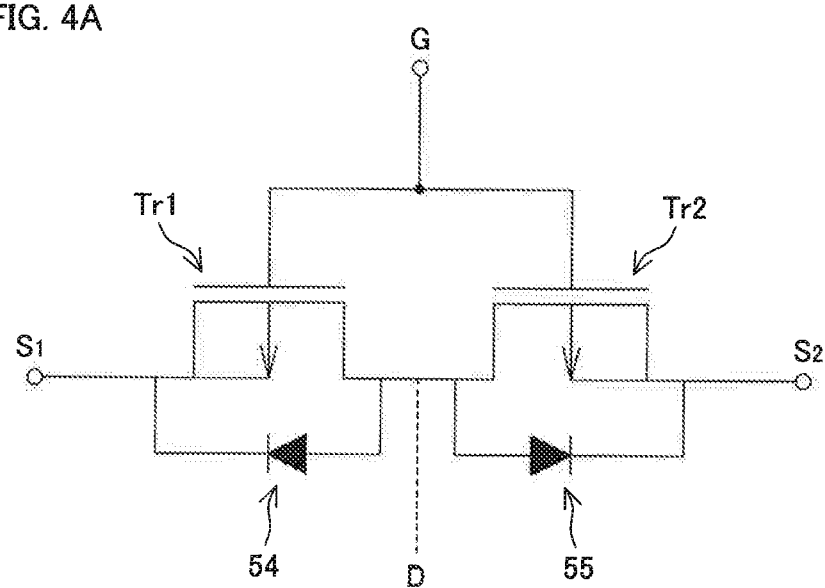
FIGS. 4A and 4B are views showing circuit configurations of the semiconductor chip.
Figure 4B:
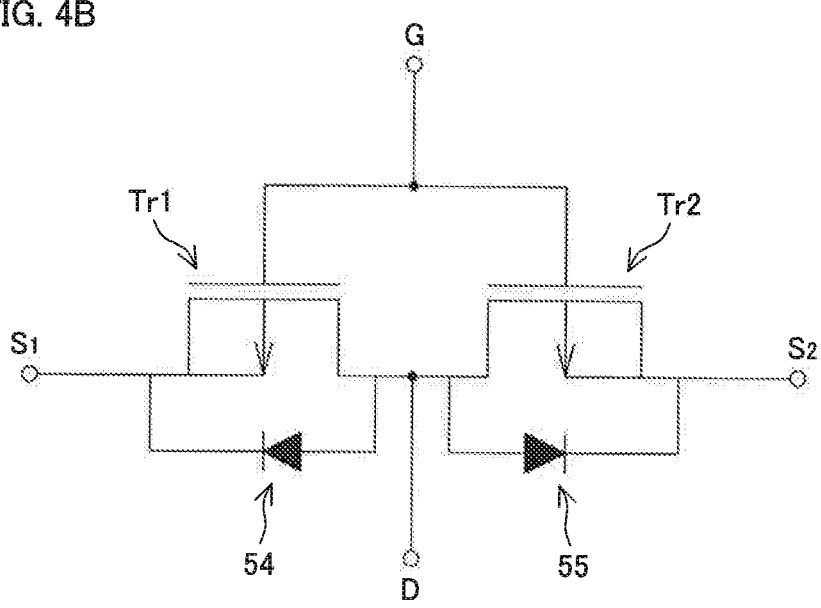
Figure 5:
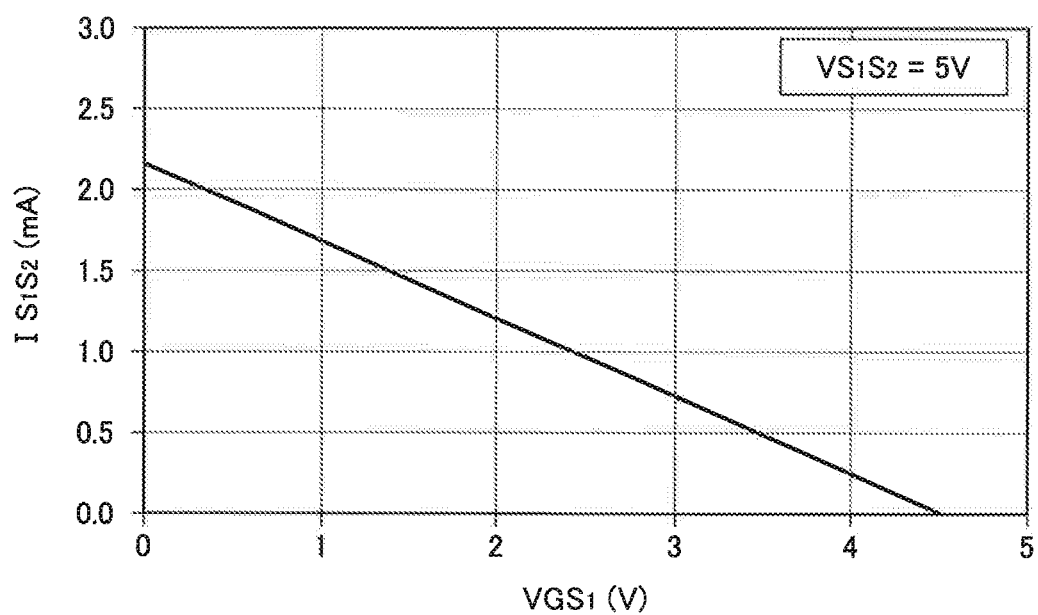
FIG. 5 is a graph showing I-V characteristics of the semiconductor chip.

FIGS. 4A and 4B are views showing circuit configurations of the semiconductor chip 6. FIG. 4A shows the configuration in which no electric potential is applied to the drain (drain is electrically floating), and FIG. 4B shows the configuration in which an electric potential is applied to the drain. FIG. 5 is a graph showing I-V characteristics of the semiconductor chip 6.

Next, with reference to FIGS. 2 and 4A, 4B, actions of the semiconductor chip 6 will be described. Correspondence relationships between alphabetical reference signs of FIGS. 4A, 4B and the configurations of FIG. 2 are as follows:

First source $S_1$: first source wiring 10
Second source $S_2$: second source wiring 11
Drain D: drain electrode 53
Gate G: gate wiring 9

First, in a state where no voltage is applied to the gate G, a voltage is applied between the first source $S_1$ and the second source $S_2$ (between $S_1$ and $S_2$). More specifically, a positive voltage (+) is applied to the first source $S_1$, and voltages of the second source $S_2$ and the gate G are 0 V. With the configuration of FIG. 4A, the drain D is electrically floating. Meanwhile, as in FIG. 4B, the drain D may be utilized as a terminal. Since the first and second gate electrodes 43, 44 are commonly connected to the third gate electrode 45, the gate electrodes are maintained at the same electric potential.

In the first transistor Tr1, an electric potential of the n type body region 28 is the same positive electric potential as the first source wiring 10 (first source $S_1$) via the n+ type body contact region 38. Thereby, due to a potential difference between the n type body region 28 and the first gate electrode 43, positive holes serving as a small number of carriers in the n type body region 28 are attracted to a contact surface between the gate insulation film 41 and the n type body region 28. A channel is formed by the attracted positive holes, the first transistor Tr1 is turned on, and an electric current $I_1$ flows from the first source $S_1$ to the p type drain region 29 via the parasitic diode 54.

By turning on the first transistor Tr1, the electric potential of the drain D becomes substantially the same electric potential as the first source $S_1$, which is higher than the electric potential of the second source $S_2$. Thereby, a forward voltage is applied to both ends of the parasitic diode 55 of the second unit cell 32, the parasitic diode 55 is brought into an ON state, and electrical conduction is formed between the p type drain region 29 and the second source $S_2$ through the parasitic diode 55. The electric current $I_1$ flowing to the p type drain region 29 flows from the p type drain region 29 to the second source $S_2$ as an electric current $I_2$. As a result, an electric current flows between the first source $S_1$ and the second source $S_2$ (between $S_1$ and $S_2$).

Meanwhile, when a positive voltage is applied to the gate G and a potential difference (VGS$_1$) between the gate G and the first source $S_1$ approaches zero, the channel formed in the n type body region 28 of the first unit cell 31 disappears, and the first transistor Tr1 is turned off. Thereby, the electric current is cut off between the first source $S_1$ and the second source $S_2$ (between $S_1$ and $S_2$).

Thus, electrical conduction is formed between $S_1$ and $S_2$ when no voltage is applied to gate G, whereas the electric current is cut off between $S_1$ and $S_2$ when the voltage is applied to the gate G. That is, a normally-on action is realized. More specifically, as shown in FIG. 5, in the semiconductor chip 6 having the structure of FIG. 2, when a voltage of 5 V is applied between the first source $S_1$ and the second source $S_2$ (between $S_1$ and $S_2$), and when no voltage is applied to the gate G, an electric current $IS_1S_2$ of about 2.2 mA between $S_1$ and $S_2$. Meanwhile, as the voltage applied to the gate G is increased, the electric current $IS_1S_2$ is decreased, and the electric current $IS_1S_2$ is cut off around a voltage value of the gate G of about 4.5 V.

In the first transistor Tr1 and the second transistor Tr2 in which the electric current is turned on/off in the semiconductor chip 6, unlike a JFET or a depletion-mode MISFET, expansion of a depletion layer is not used for turning on/off the electric current. Therefore, it is unnecessary to design the impurity concentration of impurity regions (28, 29, 37, 39, etc.) of the semiconductor layer 22 in consideration of the depletion layer. Thus, even when the transistors are downsized, a low resistance value can be maintained. Furthermore, in the semiconductor chip 6, the first transistors Tr1 and the second transistors Tr2 are integrated into one chip, and the semiconductor chip can be further downsized.

Further, between the first active region 25 and the second active region 26, the p type drain region 29 occupies the entire region on the back surface side of the surface portion of the semiconductor layer 22 (region on the lower side of the bottom portion of the gate trench 30 in the preferred embodiment). Therefore, there is no structure of blocking the electric current flowing between the first active region 25 and the second active region 26 (for example, an element separation structure with an insulation film, etc.). Thus, a current pathway can be secured in a wide range in the thickness direction of the semiconductor layer 22. As a result, a low resistance value in the semiconductor layer 22 can be favorably maintained.

Other Preferred Embodiments

Hereinafter, other preferred embodiments of the semiconductor package 1 and the semiconductor chip 6 described with reference to FIGS. 1 to 5 will be described.

Figure 6:
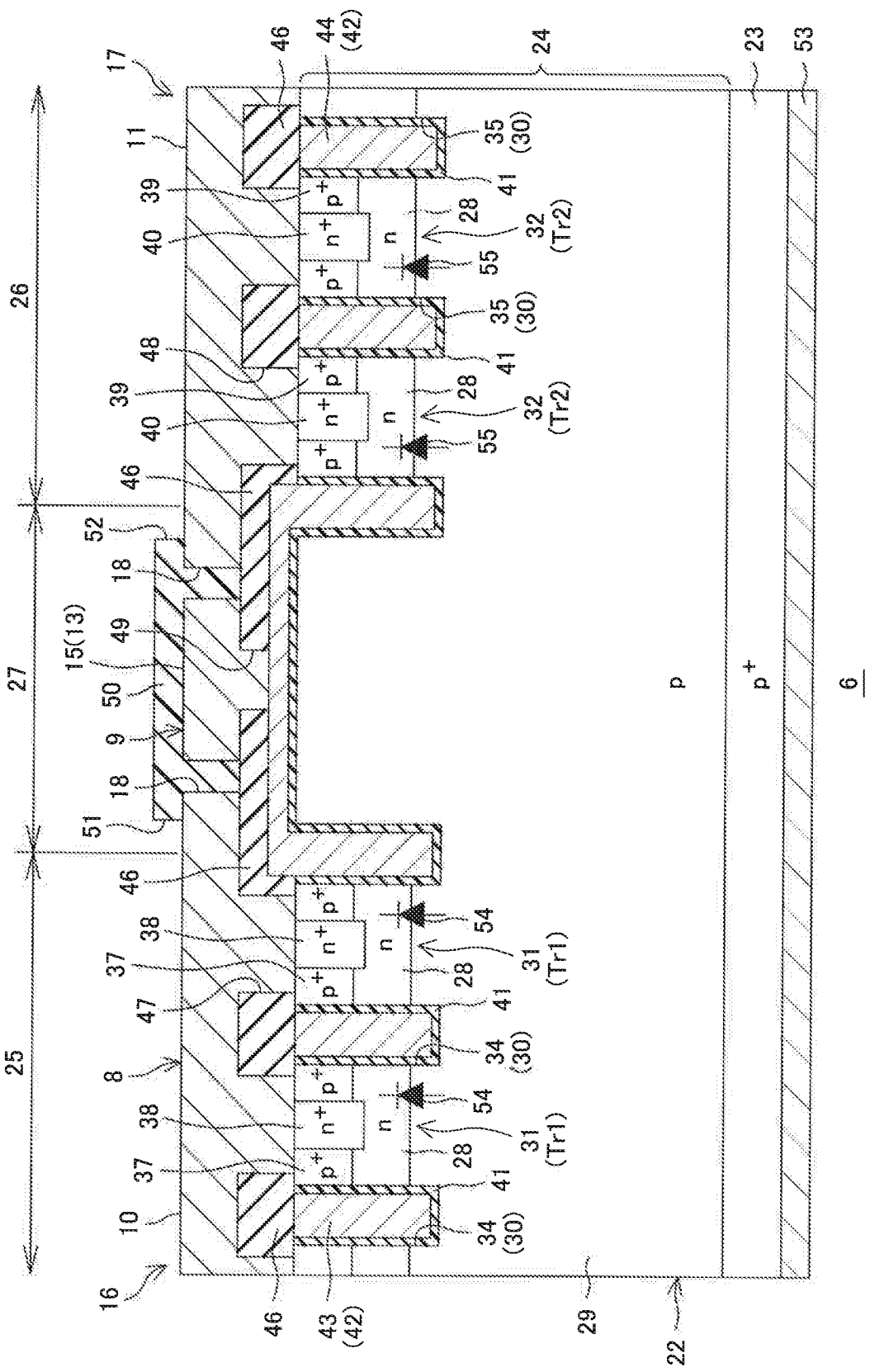
FIG. 6 is a schematic cross-sectional view of a semiconductor chip according to one of the other preferred embodiments of the present invention.

FIG. 6 is a schematic cross-sectional view of a semiconductor chip 6 according to one of the other preferred embodiments of the present invention.

In the semiconductor chip 6 shown in FIG. 2, the third gate electrode 45 embedded into the gate trench 30 is used as an electrode to commonly connect the first gate electrode 43 and the second gate electrode 44. However, the embedded third gate electrode 45 may be omitted.

In this case, as shown in FIG. 6, the first gate electrode 43 and the second gate electrode 44 may be connected to each other by a third gate electrode 56 formed along a surface of the semiconductor layer 22 (p type epitaxial layer 24) in the central region 27. The third electrode 56 is connected respectively to the first gate electrode 43 and the second gate electrode 44 from the upper side while stretching over the first gate electrode 43 and the second gate electrode 44.

As shown in FIG. 6, the n type body region 28 may be omitted in the central region 27, and part of the p type drain region 29 may occupy the place where the n type body region is omitted. This configuration may be applied to the configuration of FIG. 2 described above.

Figure 7:
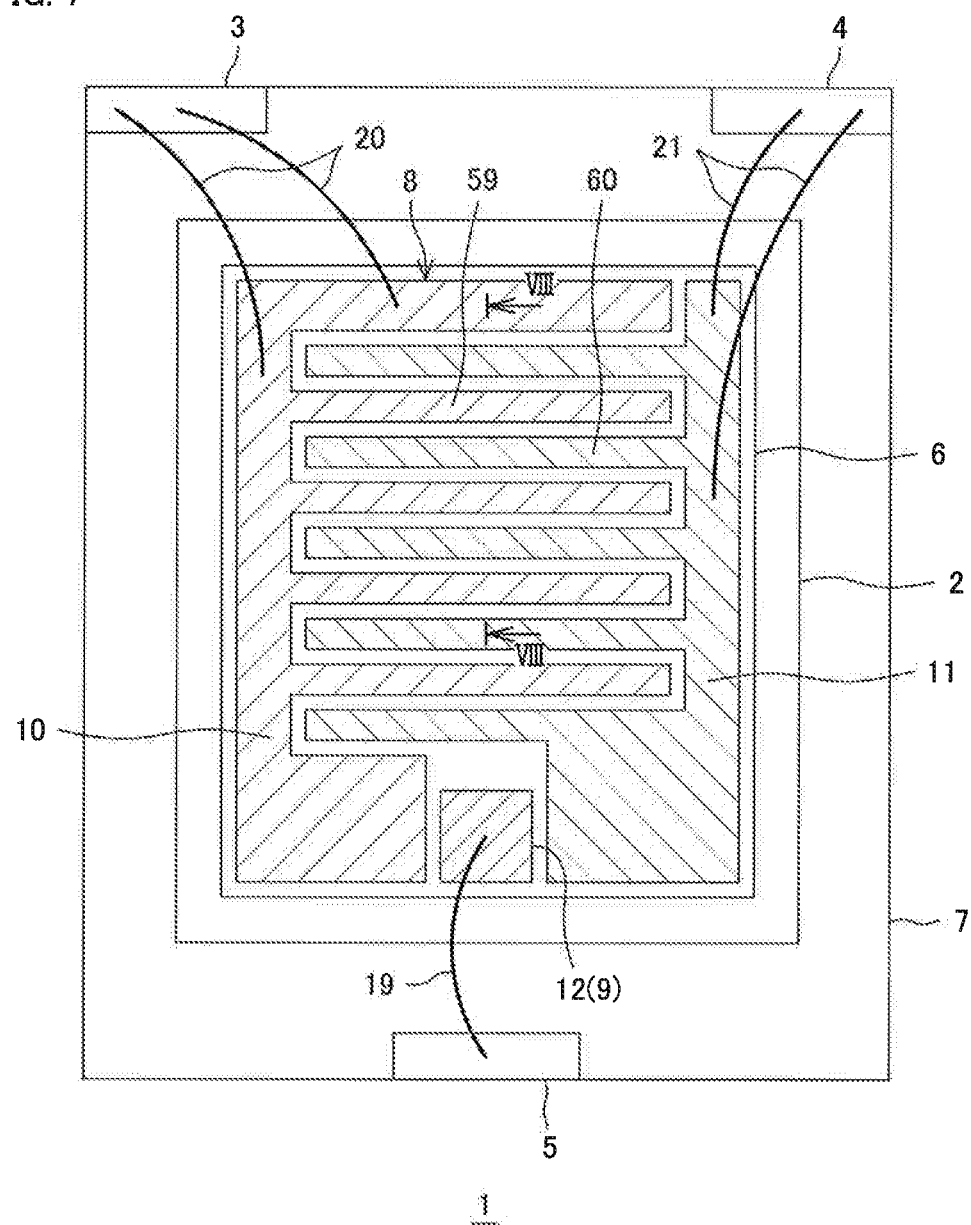
FIG. 7 is a schematic configuration diagram of a semiconductor package according to one of the other preferred embodiments of the present invention.
Figure 8:
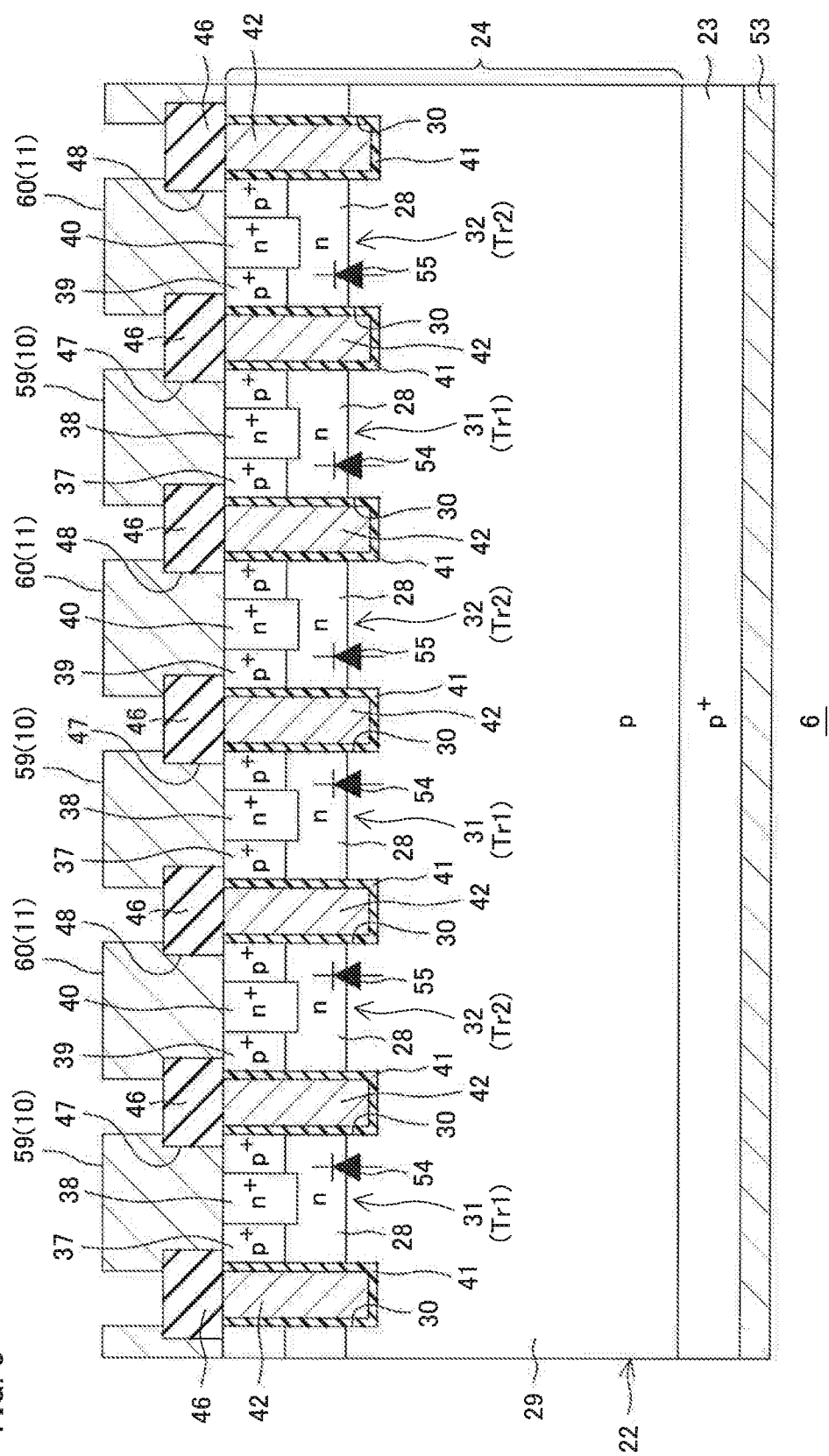
FIG. 8 is a cross-sectional view of a semiconductor chip of FIG. 7 taken along line VIII-VIII.
Figure 9:
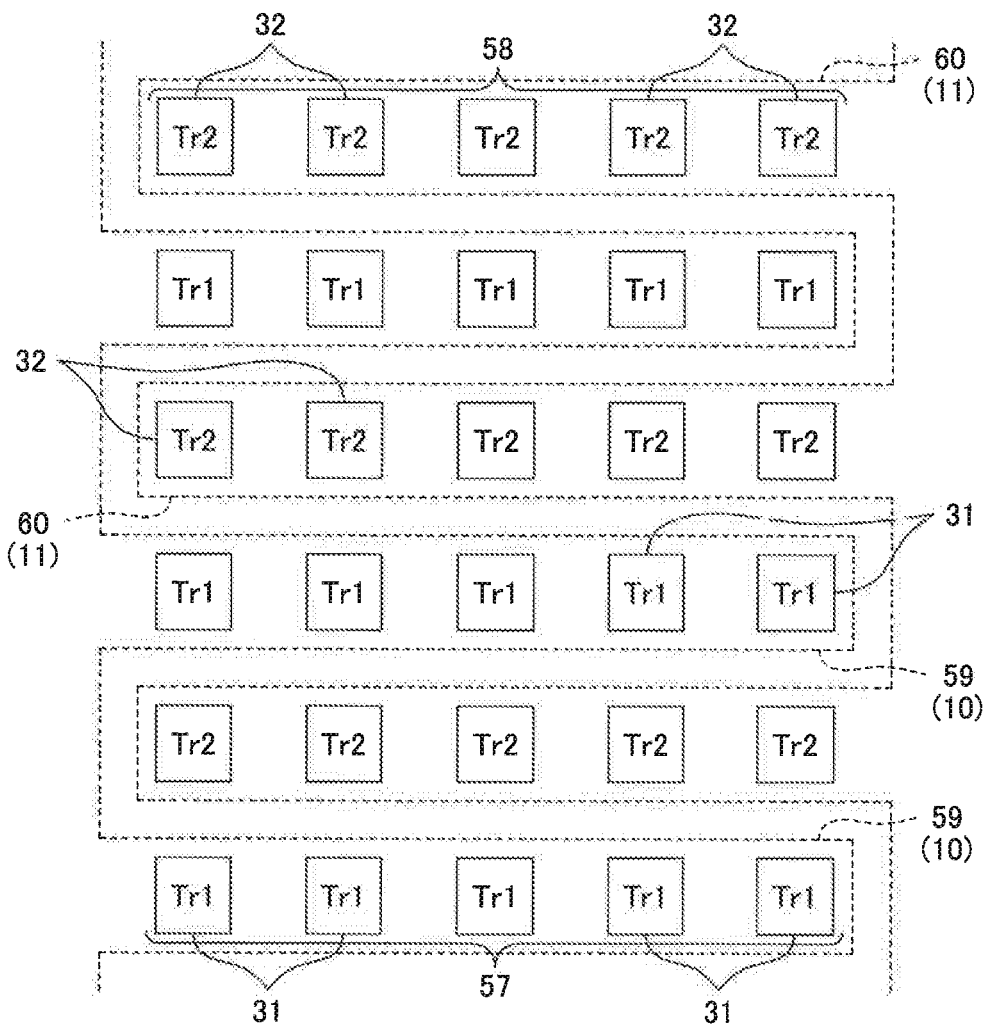
FIG. 9 is a view showing a cell layout of the first transistors and the second transistors.

FIG. 7 is a schematic configuration diagram of a semiconductor package 1 according to one of the other preferred embodiments of the present invention. FIG. 8 is a cross-sectional view of a semiconductor chip 6 of FIG. 7 taken along line VIII-VIII. FIG. 9 is a view showing a cell layout of the first transistors Tr1 and the second transistors Tr2. The gate finger 13 is omitted in FIG. 7.

In the semiconductor chip 6 of FIG. 2, the region on the semiconductor layer 22 is divided into two, and the first active region 25 is formed on one side and the second active region 26 is formed on the other side. The first source wiring 10 and the second source wiring 11 are respectively formed in a planar shape so as to cover the first active region 25 and the second active region 26.

Meanwhile, in the semiconductor chip 6 of FIG. 7, the first source wiring 10 and the second source wiring 11 are formed into a comb shape to be engaged with the each other while being spaced from each other. In this case, as shown in FIGS. 8 and 9, in the semiconductor layer 22, linear first unit cell rows 57 each of which is formed by the plurality of first unit cells 31 and linear second unit cell rows 58 each of which is formed by the plurality of second unit cells 32 may be spaced from each other and alternately arranged.

As shown in FIG. 9, by respectively providing each of teeth portions 59, 60 of the first source wiring 10 and the second source wiring 11 of the comb shape on the upper side of each of the first unit cell rows 57 and the second unit cell rows 58, contact between the first source wiring 10 and the first transistors Tr1 (p+ type source region 37), and contact between the second source wiring 11 and the second transistors Tr2 (p+ type source region 39) can be easily obtained.

With the configurations of FIGS. 7 to 9, irrespective of positions of the first transistors Tr1, the distance between the first transistors Tr1 to the second transistors Tr2 can be equalized over the entire semiconductor layer 22. Thus, unevenness of the electric current between the cells can be suppressed.

Figure 10:
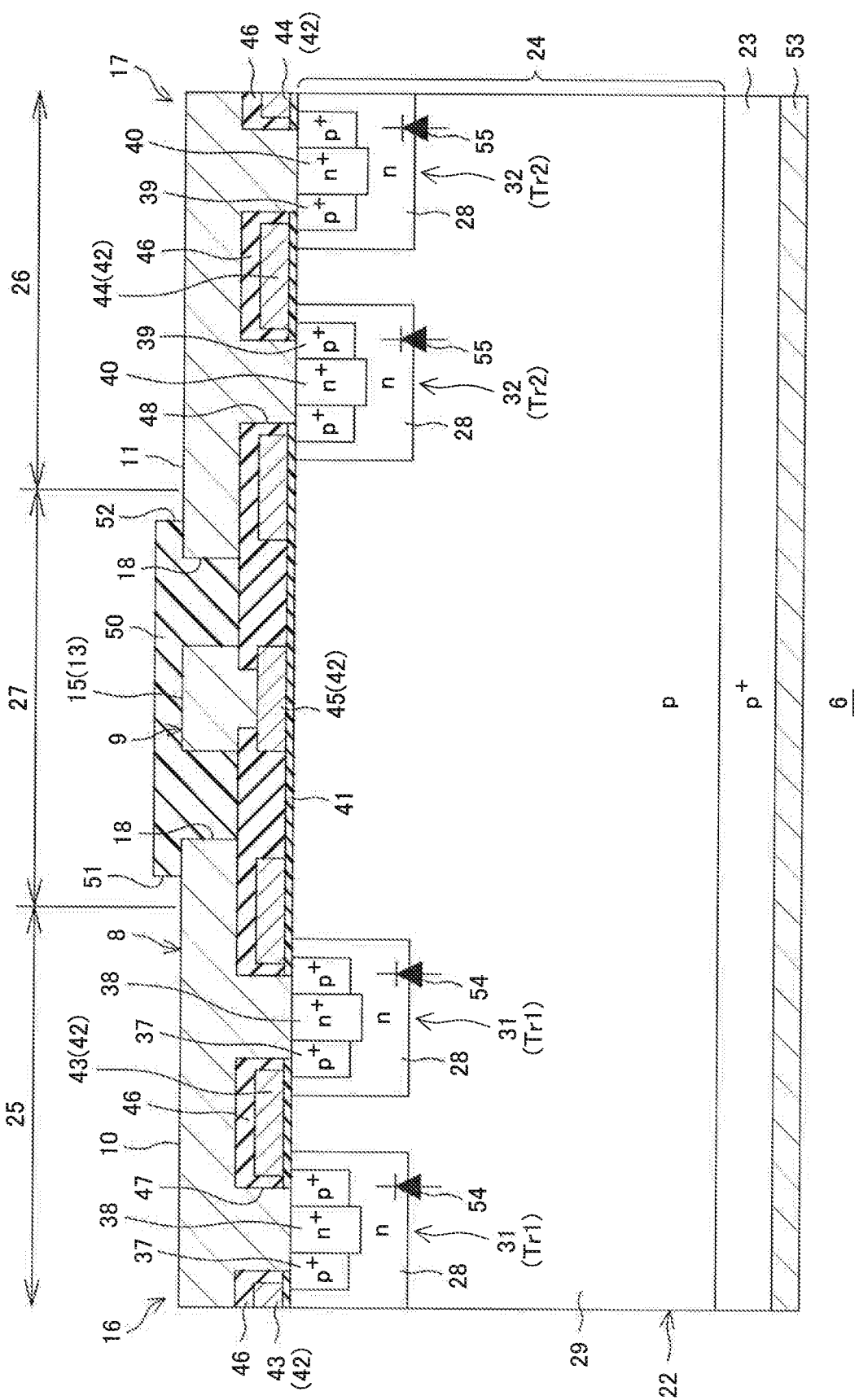
FIG. 10 is a schematic cross-sectional view of a semiconductor chip according to one of the other preferred embodiments of the present invention.

FIG. 10 is a schematic cross-sectional view of a semiconductor chip 6 according to one of the other preferred embodiments of the present invention.

In the semiconductor chip 6 of FIG. 2, the MISFETs of the trench gate structure are adopted as the first transistors Tr1 and the second transistors Tr2. However, MISFETs of a planar gate structure may also be adopted as shown in FIG. 10.

In first and second transistors Tr1, Tr2 of the planar gate structure, the gate insulation film 41 is formed on the surface of the semiconductor layer 22, and the gate electrode 42 is formed on the gate insulation film 41. The first gate electrode 43 and the second gate electrode 44 respectively face portions of the n type body region 28 exposed on the surface of the semiconductor layer 22.

Figure 11:
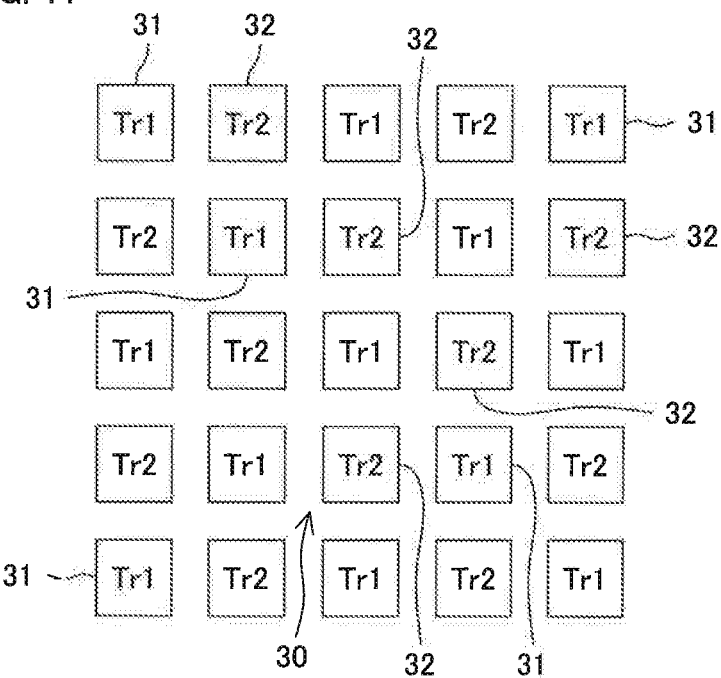
FIG. 11 is a view showing a cell layout of the first transistors and the second transistors.

FIG. 11 is a view showing a cell layout of the first transistors Tr1 and the second transistors Tr2.

In the semiconductor chip 6 of FIG. 2, the plurality of first unit cells 31 (first transistors Tr1) and the plurality of second unit cells 32 (second transistors Tr2) are respectively integrated into the fixed regions (of the first active region 25 and the second active region 26) and arranged.

Meanwhile, the plurality of first unit cells 31 and the plurality of second unit cells 32 arranged in a matrix may be arranged alternately in each of the row direction and the column direction as shown in FIG. 11. With this configuration, as well as the configurations shown in FIGS. 7 to 9, the distance between the first transistors Tr1 to the second transistors Tr2 can also be equalized over the entire semiconductor layer 22. Thus, unevenness of the electric current between the cells can be suppressed.

Figure 12:
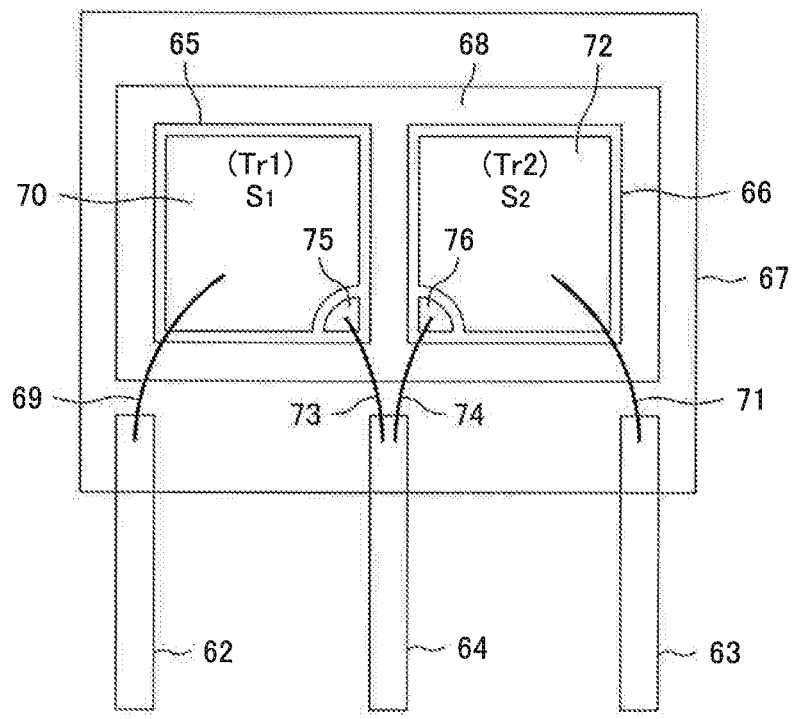
FIG. 12 is a schematic configuration diagram of a semiconductor package according to one of the other preferred embodiments of the present invention.

FIG. 12 is a schematic configuration diagram of a semiconductor package 1 according to one of the other preferred embodiments of the present invention.

In the semiconductor package 1 of FIG. 1, the first transistors Tr1 and the second transistors Tr2 are integrated into one semiconductor chip 6 and formed into one chip. However, with a semiconductor device satisfying the circuit configuration diagrams shown in FIGS. 4A, 4B, for example, a mode shown in FIG. 12 may also be available.

The semiconductor package 1 of FIG. 12 includes an island 68, a plurality of 1 terminals 62 to 64, a first semiconductor chip 65, a second semiconductor chip 66, and the sealing resin 7.

Both the first semiconductor chip 65 and the second semiconductor chip 66 are provided in the island 68. That is, the island 68 may serve as a common electrode for drains of the first semiconductor chip 65 (first transistors Tr1) and the second semiconductor chip 66 (second transistors Tr2).

The plurality of terminals 62 to 64 include a first source terminal 62, a second source terminal 63, and a gate terminal 64.

The first source terminal 62 is connected to a source pad 70 of the first semiconductor chip 65 via a bonding wire 69. Meanwhile, the second source terminal 63 is connected to a source pad 72 of the second semiconductor chip 66 via a bonding wire 71.

The gate terminal 64 is connected to a gate pad 75 of the first semiconductor chip 65 and a gate pad 76 of the second semiconductor chip 66 via bonding wires 73, 74. That is, the gate terminal 64 is a common electrode for gates of the first semiconductor chip 65 (first transistors Tr1) and the second semiconductor chip 66 (second transistors Tr2).

Figure 13:
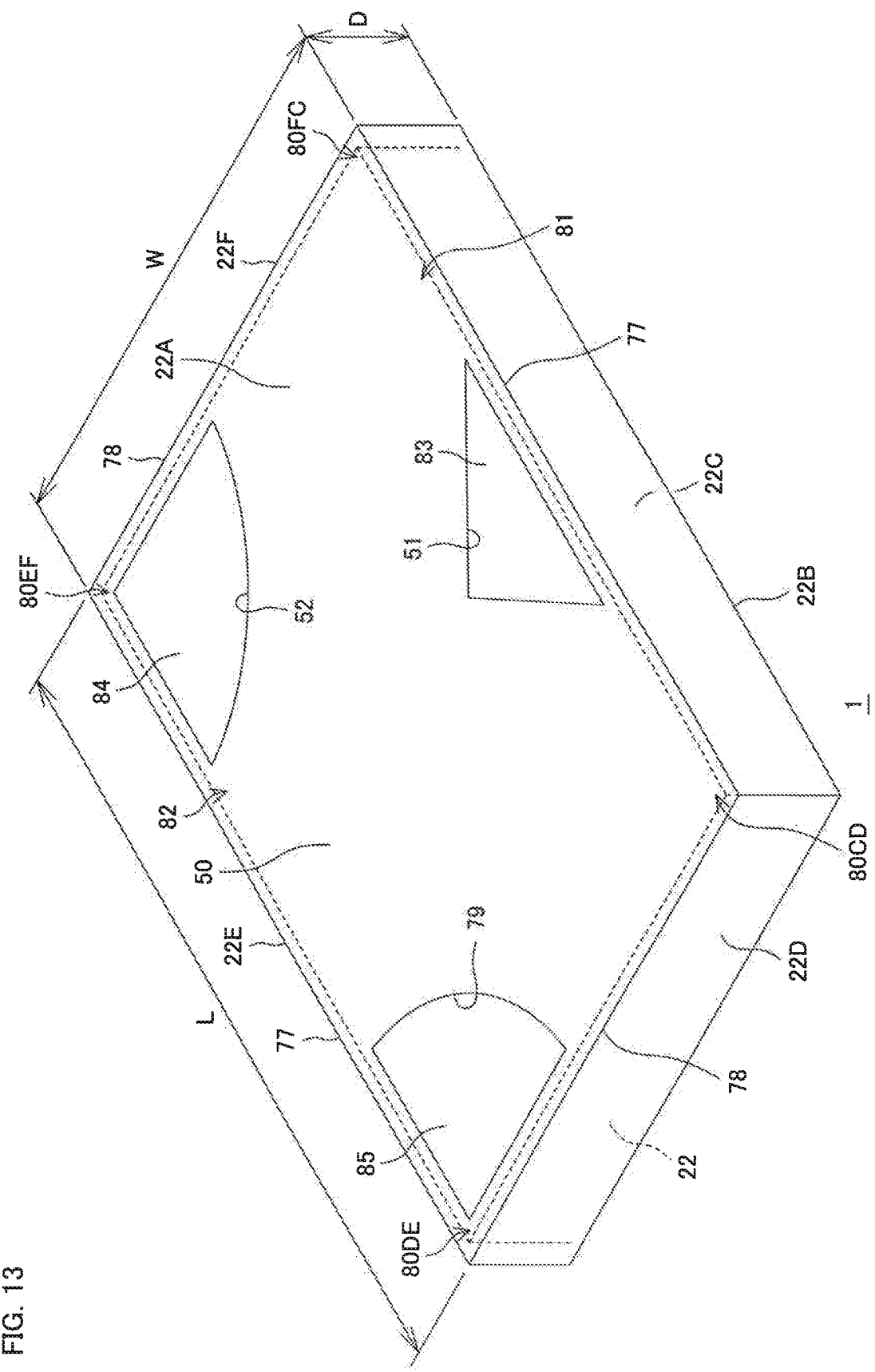
FIG. 13 is a schematic perspective view of a semiconductor package according to one of the other preferred embodiments of the present invention.
Figure 14:
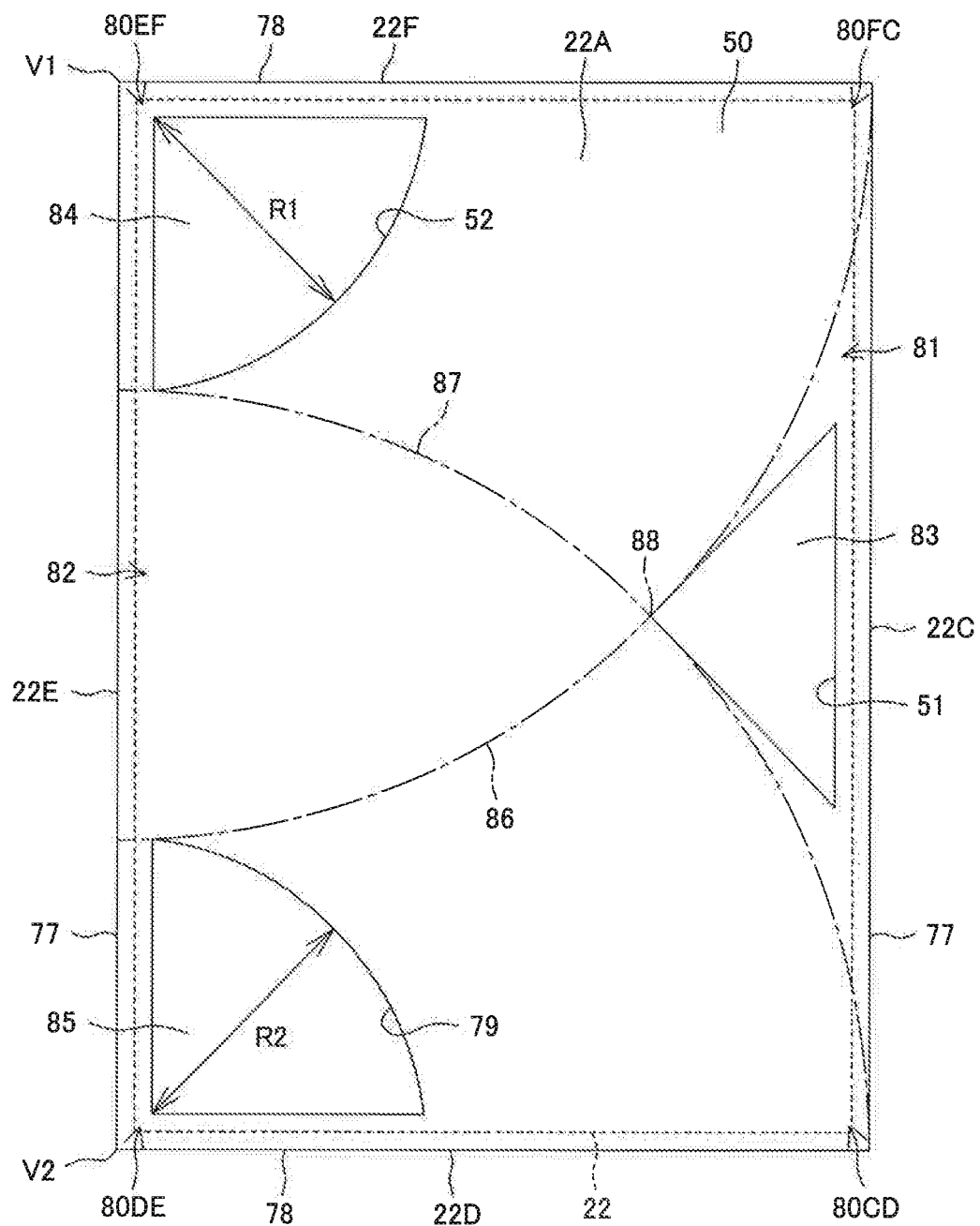
FIG. 14 is a schematic plan view of the semiconductor package of FIG. 13.
Figure 15:
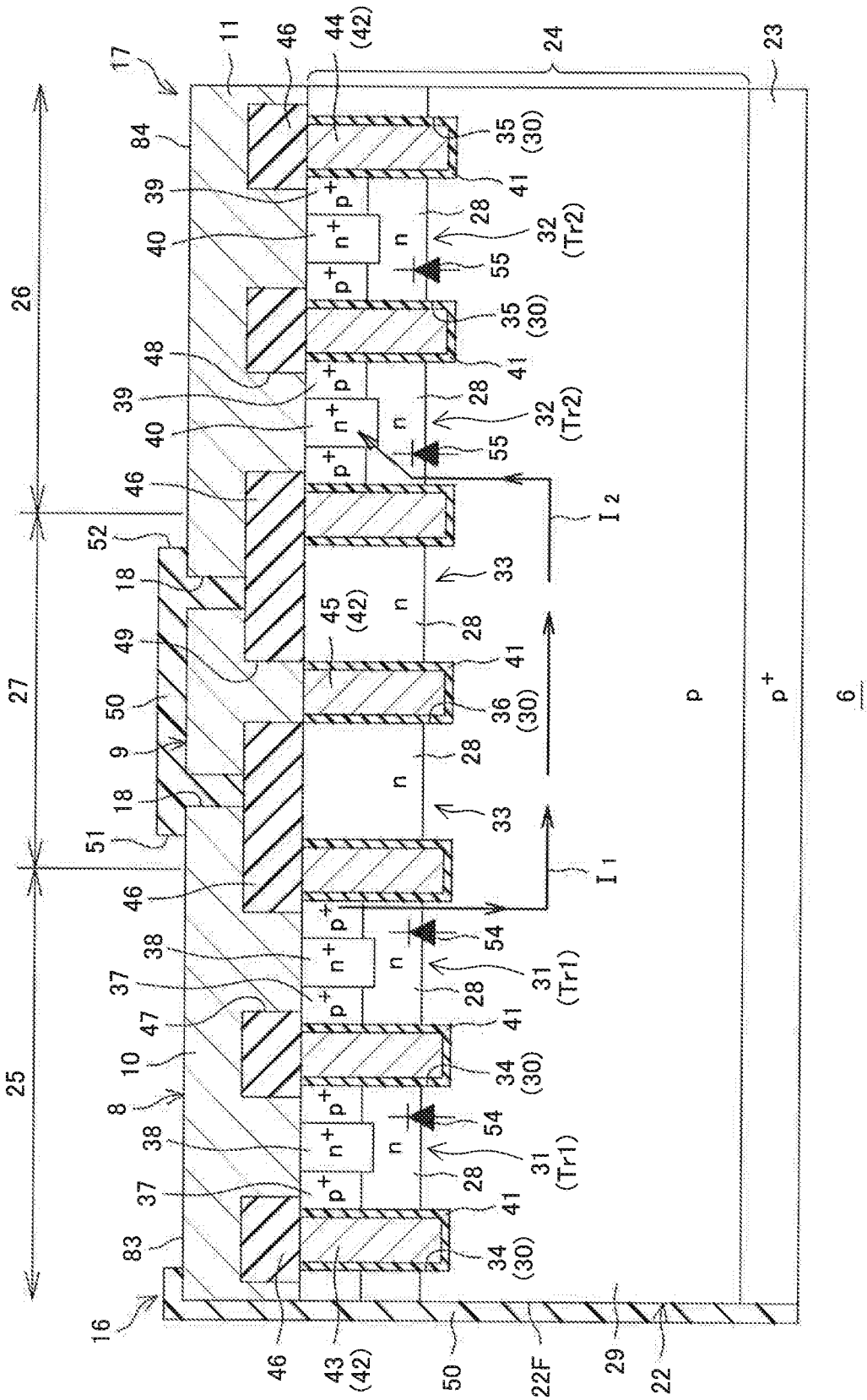
FIG. 15 is a schematic cross-sectional view of the semiconductor package of FIG. 13.

FIG. 13 is a schematic perspective view of a semiconductor package 1 according to one of the other preferred embodiments of the present invention. FIG. 14 is a schematic plan view of the semiconductor package 1 of FIG. 13. FIG. 15 is a schematic cross-sectional view of the semiconductor package 1 of FIG. 13. FIG. 15 does not show a section of specific portions of FIGS. 13 and 14 but selectively shows constituent elements required for illustrating the internal structure of the semiconductor package 1.

The semiconductor package 1 of FIGS. 13 and 14 has a package structure of WL-CSP (Wafer Level-Chip Size Package). That is, in the semiconductor package 1, the semiconductor chip 6 described above has a semiconductor layer 22 (semiconductor substrate) of a rectangular shape in a plan view, and the semiconductor chip is formed at substantially the same size as external size of the semiconductor layer 22. For example, length L of the semiconductor package 1 is less than 0.50 mm (preferably, 0.40 mm or more), width W is less than 0.40 mm (preferably, 0.30 mm or more), and thickness D is less than 0.15 mm (preferably, 0.10 mm or more). That is, the semiconductor package 1 has a highly small package structure of 0403 size. With the thickness of the semiconductor package 1 of less than 0.15 mm, even when the semiconductor package 1 is installed but inclined, a projecting amount of a side surface of the semiconductor package 1 from a normal position can be reduced. Thereby, even in a case where the semiconductor packages 1 are highly densely packed, contact with an adjacent semiconductor package can be suppressed.

The semiconductor package 1 has the WL-CSP package structure. Thus, in the following description, when a shape, size, arrangement positions of other constituent elements regarding the semiconductor package 1 and the semiconductor layer 22, etc., are described, the subject of the description may be replaced with the other. For example, the semiconductor layer 22 of a square shape in a plan view may be replaced with the semiconductor package 1 of a square shape in a plan view, or the description that a pad is arranged in a peripheral edge portion of the semiconductor layer 22 may be replaced with the description that a pad is arranged in a peripheral edge portion of the semiconductor package 1.

The semiconductor layer 22 of a rectangular parallelepiped has a surface 22A, a back surface 22B on the opposite side of the surface 22A, and four side surfaces 22C, 22D, 22E, 22F between the surface 22A and the back surface 22B, and the surface 22A and the side surfaces 22C to 22F are covered with the surface protection film 50 (see FIG. 15). Among the four side surfaces 22C to 22F of the semiconductor layer 22, the side surfaces 22C, 22E are side surfaces along long sides 77 of the semiconductor layer 22, and the side surfaces 22D, 22F are side surfaces along short sides 78 of the semiconductor layer 22. In crossing portions of the adjacent side surfaces 22C to 22F, corner portions 80CD, 80DE, 80EF, 80FC of the semiconductor layer 22 are formed.

On the surface 22A of the semiconductor layer 22, a first source pad 83 is arranged in a first peripheral edge portion 81 along one side surface 22C on the side of the long side 77. The first source pad 83 is a portion where part of the first source wiring 10 is exposed from the pad opening 51 as shown in FIG. 15. The first source pad 83 is formed in a central portion spaced from both the end corner portions 80CD, 80FC of the first peripheral edge portion 81. A region of a fixed interval (such as about 0.1 mm to 0.15 mm) covered with the surface protection film 50 is provided between the first source pad 83 and each of the corner portions 80CD, 80FC.

Meanwhile, a second source pad 84 is arranged in one end corner portion 80EF of a second peripheral edge portion 82 of the semiconductor layer 22 facing the first peripheral edge portion 81, and a gate pad 85 is arranged in the other end corner portion 80DE of the second peripheral edge portion 82. As shown in FIG. 15, the second source pad 84 is a portion where part of the second source wiring 11 is exposed from the pad opening 52. Meanwhile, the gate pad 85 is a portion where part of the gate wiring 9 is exposed from a pad opening 79 (see FIGS. 13, 14) at a position not shown in FIG. 15.

In the semiconductor package 1 of FIGS. 13 to 15, a layout of the gate wiring 9, the first source wiring 10, and the second source wiring 11 may be the layout shown in FIG. 1 (the gate pad 85 is arranged in the corner portion 80DE), or by making the structure on the semiconductor layer 22 a multilayer wiring structure, the gate wiring 9, the first source wiring 10, and the second source wiring 11 may be arranged in an appropriate form at an appropriate size so as not to contact with each other.

Next, a layout and a shape of the first source pad 83, the second source pad 84, and the gate pad 85 will be described.

As shown in FIG. 14, providing that a first arc 86 with a top V1 of the one end corner portion 80EF of the second peripheral edge portion 82 as a center and with length (width W of FIG. 13) of the short side 78 of the semiconductor layer 22 as a radius, and a second arc 87 with a top V2 of the other end corner portion 80DE of the second peripheral edge portion 82 as a center and with the length (width W of FIG. 13) of the short side 78 of the semiconductor layer 22 as a radius are formed on the surface 22A of the semiconductor layer 22, the first source pad 83 is arranged in a region on the outer side of the first arc 86 and in a region on the outer side of the second arc 87. The first source pad 83 is formed into a triangle having a pair of tangent lines respectively running from an intersection point 88 between the first arc 86 and the second arc 87 to the first arc 86 and the second arc 87, the tangent lines serving as two sides of the triangle.

Meanwhile, the second source pad 84 is formed into a fan shape concentric to the first arc 86. A radius R1 of the second source pad 84 is, for example, 0.1 mm to 0.13 mm. The gate pad 85 is formed into a fan shape concentric to the second arc 87. A radius R2 of the gate pad 85 is, for example, 0.1 mm to 0.13 mm.

The semiconductor package 1 of FIGS. 13 to 15 has the WL-CSP package structure, which is a wireless structure in which no bonding wires are used for any of the electric connections inside the package. Thereby, wire resistance can also be reduced. Thus, on-resistance per package size can be decreased to a great extent.

Although the semiconductor package 1 has the WL-CSP package structure, the side surfaces 22C to 22F of the semiconductor layer 22 are covered with the surface protection film 50. Therefore, in a case where the semiconductor packages 1 are highly densely packed, a short circuit with an adjacent semiconductor package can be suppressed.

Although the embodiments of the present invention have heretofore been described referring to FIGS. 1 to 15, the configurations of the semiconductor package 1 and the semiconductor chip 6 are not limited to the configurations described above but various design changes can be made within a range of the matters described in the claims.

For example, in the above preferred embodiments, only the elements of a vertical structure are shown as the first transistors Tr1 and the second transistors Tr2. However, elements of a horizontal structure can also be applied.

Figure 16:
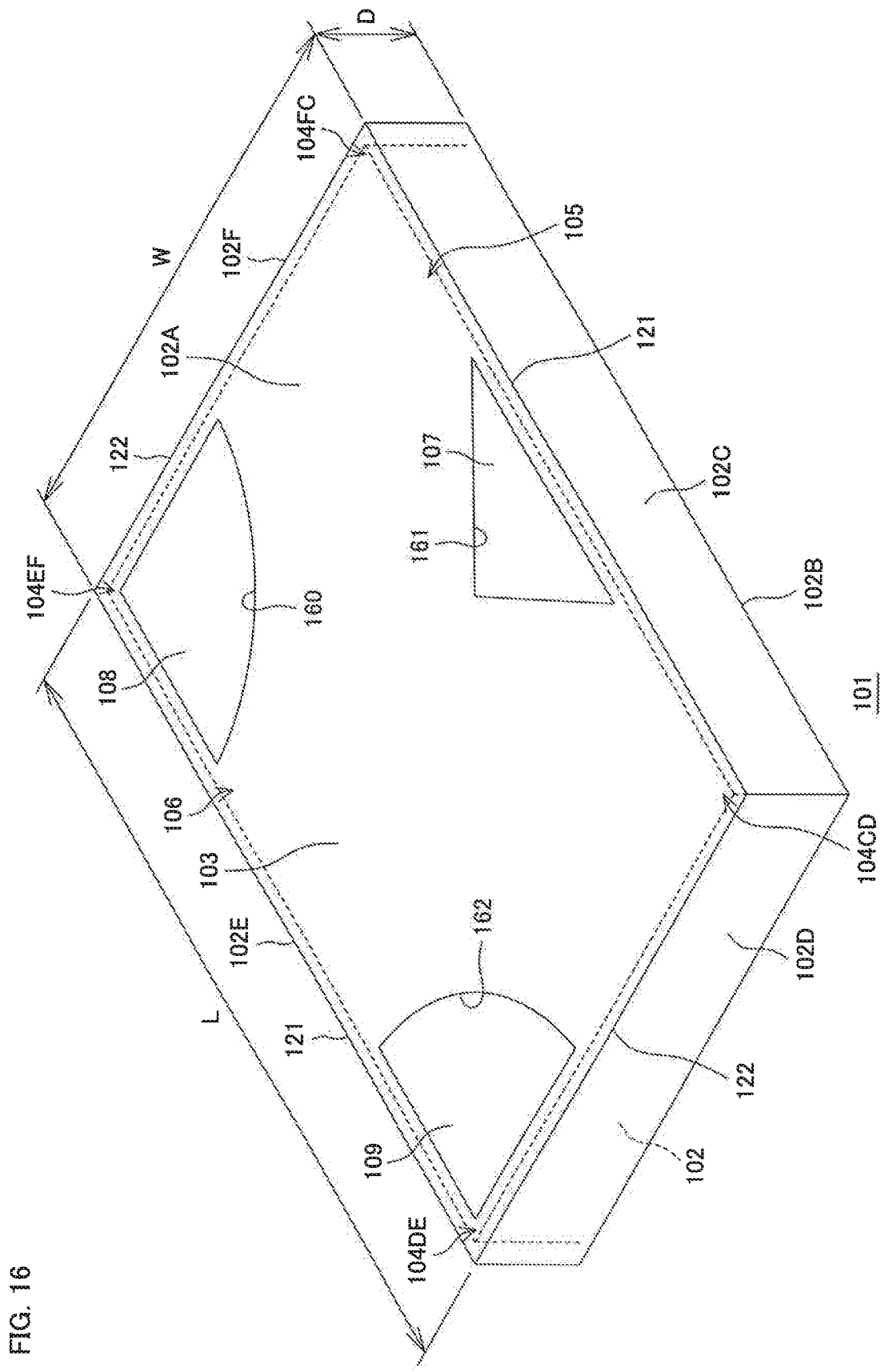
FIG. 16 is a schematic perspective view of a semiconductor device according to one preferred embodiment of the present invention.
Figure 17:
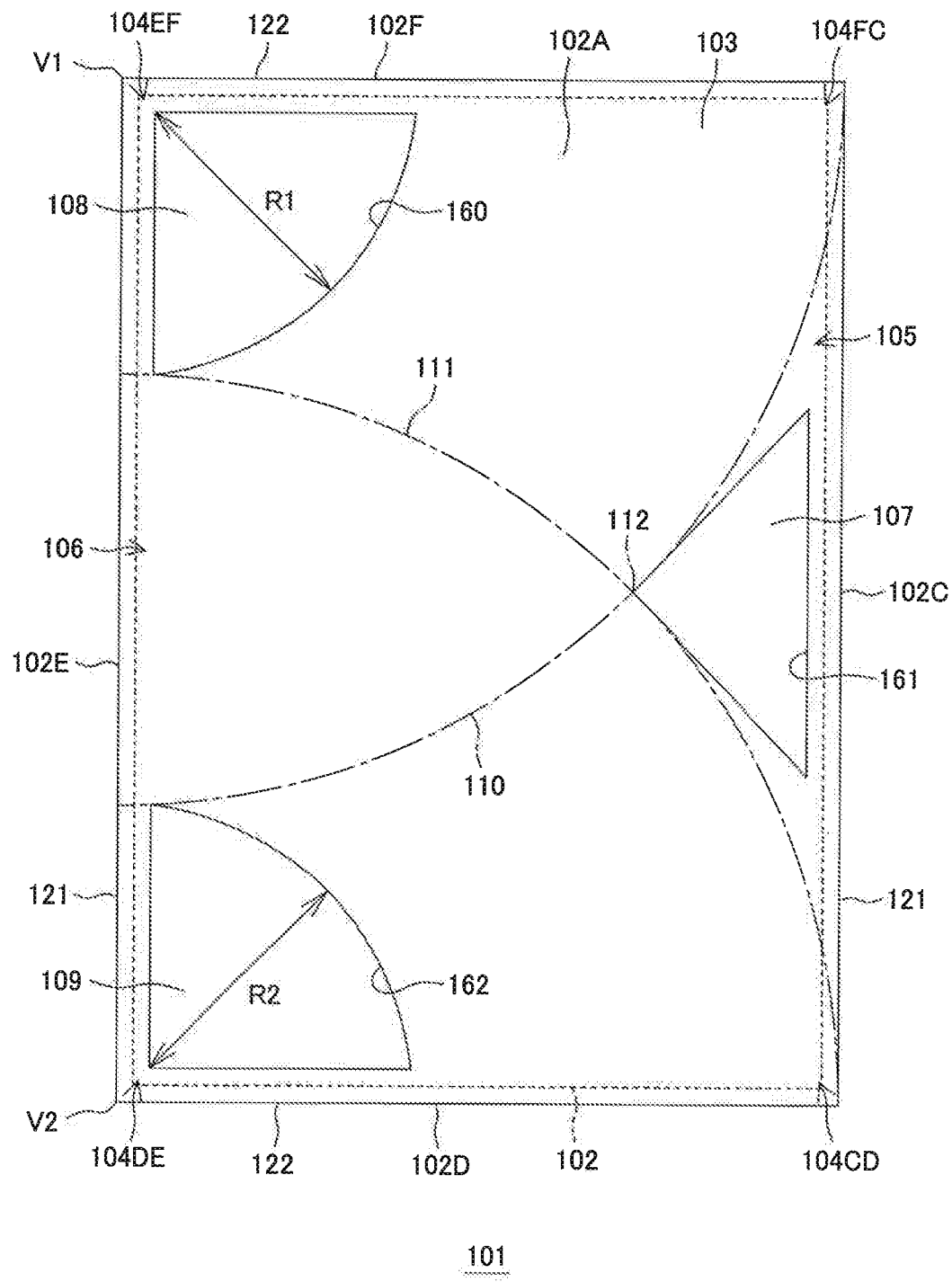
FIG. 17 is a schematic plan view of the semiconductor device.

FIG. 16 is a schematic perspective view of a semiconductor device 101 according to one preferred embodiment of the present invention. FIG. 17 is a schematic plan view of the semiconductor device 101 according to the preferred embodiment of the present invention.

The semiconductor device 101 has a package structure of WL-CSP (Wafer Level-Chip Size Package). That is, the semiconductor device 101 has a semiconductor substrate 102 of a rectangular shape in a plan view, and the semiconductor device is formed at substantially the same size as external size of the semiconductor substrate 102. For example, length L of the semiconductor device 101 is less than 0.50 mm (preferably, 0.40 mm or more), width W is less than 0.40 mm (preferably, 0.30 mm or more), and thickness D is less than 0.15 mm (preferably, 0.10 mm or more). For example, in a case where the length L of the semiconductor device 101 is 0.50 mm and the width W is 0.40 mm, a planar area of the semiconductor device 101 is 0.20 mm². In a case where the length L of the semiconductor device 101 is 0.40 mm and the width W is 0.30 mm, a planar area of the semiconductor device 101 is 0.12 mm². That is, the semiconductor device 101 has a highly small package structure of 0403 size. With the thickness of the semiconductor device 101 of less than 0.15 mm, even when the semiconductor device 101 is installed but inclined, a projecting amount of a side surface of the semiconductor device 101 from a normal position can be reduced. Thereby, even in a case where the semiconductor packages 1 are highly densely packed, contact with an adjacent semiconductor device can be suppressed.

The semiconductor device 101 has the WL-CSP package structure. Thus, in the following description, when a shape, size, arrangement positions of other constituent elements regarding the semiconductor device 101 and the semiconductor substrate 102, etc., are described, the subject of the description may be replaced with the other. For example, the semiconductor substrate 102 of a square shape in a plan view may be replaced with the semiconductor device 101 of a square shape in a plan view, or the description that a pad is arranged in a peripheral edge portion of the semiconductor substrate 102 may be replaced with the description that a pad is arranged in a peripheral edge portion of the semiconductor device 101.

The semiconductor substrate 102 of a rectangular parallelepiped has a surface 102A, a back surface 102B on the opposite side of the surface 102A, and four side surfaces 102C, 102D, 102E, 102F between the surface 102A and the back surface 102B, and the surface 102A and the side surfaces 102C to 102F are covered with a surface protection film 103. Among the four side surfaces 102C to 102F of the semiconductor substrate 102, the side surfaces 102C, 102E are side surfaces along long sides 121 of the semiconductor substrate 102, and the side surfaces 102D, 102F are side surfaces along short sides 122 of the semiconductor substrate 102. In crossing portions of the adjacent side surfaces 102C to 102F, corner portions 104CD, 104DE, 104EF, 104FC of the semiconductor substrate 102 are formed.

On the surface 102A of the semiconductor substrate 102, a drain pad 107 (first pad) is arranged in a first peripheral edge portion 105 along one side surface 102C on the side of the long side 121. The drain pad 107 is formed in a central portion spaced from both the end corner portions 104CD, 104FC of the first peripheral edge portion 105. A region of a fixed interval (such as about 0.1 mm to 0.15 mm) covered with the surface protection film 103 is provided between the drain pad 107 and each of the corner portions 104CD, 104FC.

Meanwhile, a source pad 108 (second pad) is arranged in one end corner portion 104EF of a second peripheral edge portion 106 of the semiconductor substrate 102 facing the first peripheral edge portion 105, and a gate pad 109 (third pad) is arranged in the other end corner portion 104DE of the second peripheral edge portion 106.

Next, a layout and a shape of the drain pad 107, the source pad 108, and the gate pad 109 will be described.

As shown in FIG. 17, providing that a first arc 110 with a top V1 of the one end corner portion 104EF of the second peripheral edge portion 106 as a center and with length (width W of FIG. 16) of the short side 122 of the semiconductor substrate 102 as a radius, and a second arc 111 with a top V2 of the other end corner portion 104DE of the second peripheral edge portion 106 as a center and with the length (width W of FIG. 16) of the short side 122 of the semiconductor substrate 102 as a radius are formed on the surface 102A of the semiconductor substrate 102, the drain pad 107 is arranged in a region on the outer side of the first arc 110 and in a region on the outer side of the second arc 111. The drain pad 107 is formed into a triangle having a pair of tangent lines respectively running from an intersection point 112 between the first arc 110 and the second arc 111 to the first arc 110 and the second arc 111, the tangent lines serving as two sides of the triangle.

Meanwhile, the source pad 108 is formed into a fan shape concentric to the first arc 110. A radius R1 of the source pad 108 is, for example, 0.07 mm to 0.13 mm (preferably, 0.10 mm or more). For example, in a case where the radius R1 is 0.07 mm, an area of the source pad 108 is $3.85 \times 10^{-3}$ mm². In a case where the radius R1 is 0.10 mm, the area of the source pad 108 is $7.85 \times 10^{-3}$ mm². The gate pad 109 is formed into a fan shape concentric to the second arc 111. A radius R2 of the gate pad 109 is, for example, 0.07 mm to 0.13 mm (preferably, 0.10 mm or more). For example, in a case where the radius R2 is 0.07 mm, an area of the gate pad 109 is $3.85 \times 10^{-3}$ mm². In a case where the radius R2 is 0.10 mm, the area of the gate pad 109 is $7.85 \times 10^{-3}$ mm².

Next, to what extent an installation area of the semiconductor device 101 can be reduced by the layout and the shape of the drain pad 107, the source pad 108, and the gate pad 109 described above will be described with reference to FIG. 18.

Figure 18:
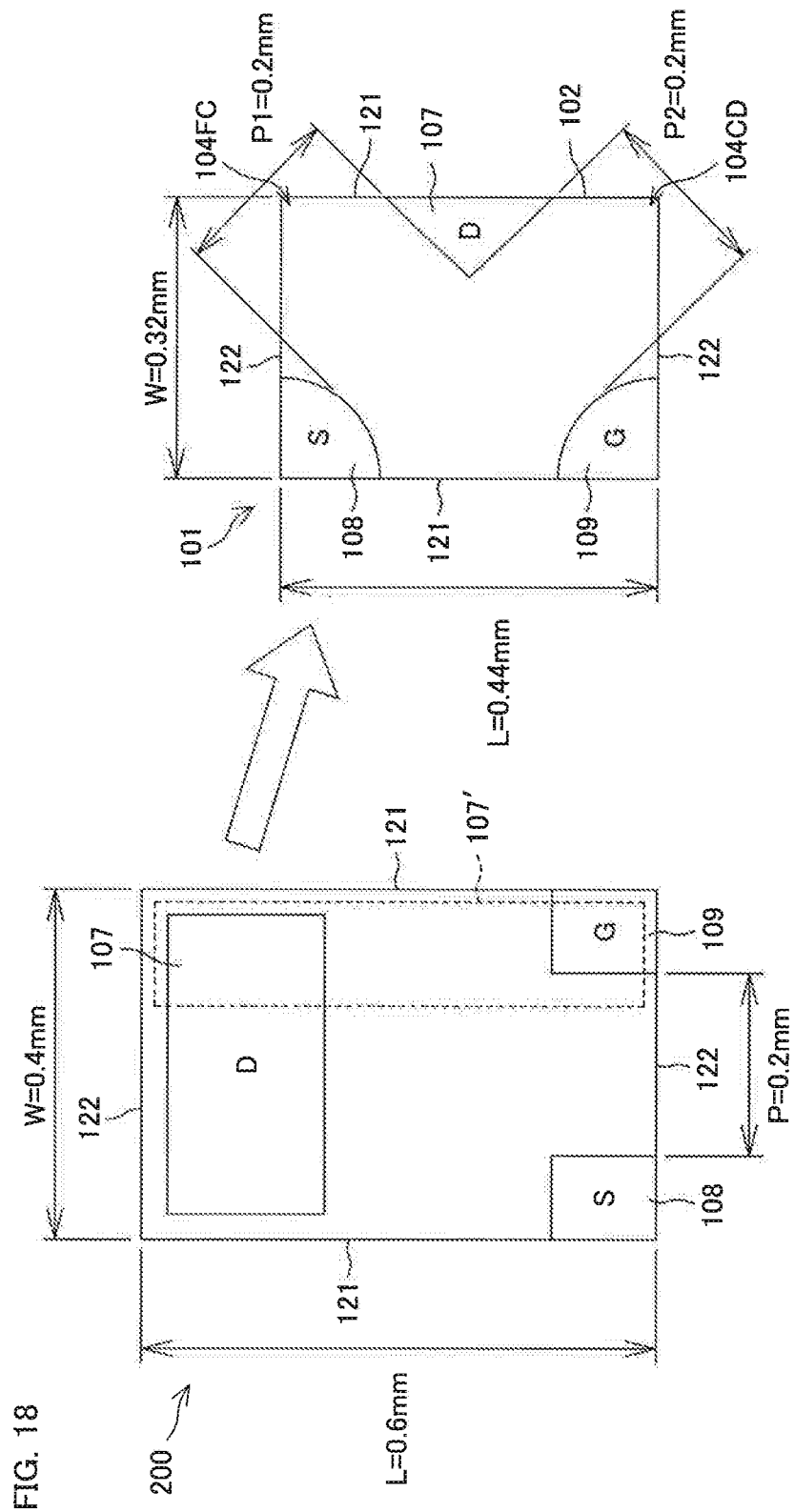
FIG. 18 is a view for comparing chip size between the semiconductor device and a semiconductor device according to a comparative mode.

FIG. 18 is a view for comparing chip size between the semiconductor device 101 and a semiconductor device 200 according to a comparative mode. For clarification, FIG. 18 shows, among the reference signs shown in FIGS. 16 and 17, those required for comparison, and the other reference signs are omitted.

First, as in the semiconductor device 200 of the comparative mode, in a case where the source pad 108 and the gate pad 109 are adjacently arranged in the short side 122 of the semiconductor substrate 102, package size of the semiconductor device 200 is, for example, length L=0.6 mm and width W=0.4 mm. This is to avoid a short circuit between the source and the gate in the short side direction, and secure at least pitch P=0.2 mm as a distance between the source pad 108 and the gate pad 109. The drain pad 107 is formed into a shape running from the one end corner portion of the short side 122 to the other end corner portion. Therefore, when the package size is reduced without changing the pad layout, the pitch P between the source and the gate falls below 0.2 mm, and a problem of a short circuit between the source and the gate is caused at the time of installation. Meanwhile, even when the source pad 108 and the gate pad 109 are adjacently arranged in the long side 121, the problem of a short circuit between the pads is not easily solved. This is because with the pad layout, as shown by the reference sign "107'" and a broken line, the drain pad 107 is formed into a shape running from the one end corner portion of the long side 121 to the other end corner portion. Therefore, in accordance with reduction in the package size, the problem of a short circuit between the source and the drain or between the gate and the drain is caused.

Meanwhile, with the configuration of the semiconductor device 101 described above, the source pad 108 and the gate pad 109 are adjacently arranged in the long side 121. Further, the drain pad 107 is arranged in the central portion of the long side 121 of the semiconductor substrate 102, and the region of the fixed interval covered with the surface protection film 103 is provided between the drain pad 107 and each of both the corner portions 104CD, 104FC of the long side 121. Thereby, a distance between the drain pad 107 and the source pad 108 (pitch P1), and a distance between the drain pad 107 and the gate pad 109 (pitch P2) can be extended in comparison to the semiconductor device 200 of the comparative mode. Therefore, even when the package size of the semiconductor device 101 is reduced with length L=0.44 mm and width W=0.32 mm, the pitch P1 and the pitch P2 can be maintained to be 0.2 mm which is similar to the pitch P between the source and the gate in the semiconductor device 200. That is, the distances between the pads are 62.5% (0.20/0.32) or more of the short side 122 of the package of the semiconductor device 101. At least in a case where the short side 122 of the package is 0.40 mm, the distances secured between the pads are 50% (0.20/0.40) or more of the short side 122 of the package of the semiconductor device 101. In a case where the package size of the semiconductor device 101 is $1.41 \times 10^{-1}$ mm$^2$, and the pad radiuses R1, R2 are 0.10 mm, a pad area is $7.85 \times 10^{-3}$ mm$^2$. Thus, the area of the source pad 108 and the gate pad 109 (pad area) is 5% or more of the package size. Therefore, while avoiding a short circuit at the time of installation, size of the semiconductor substrate can be reduced more than the semiconductor device 200. Thereby, a downsized semiconductor device can be provided.

As shown in FIG. 17, in the semiconductor device 101, the drain pad 107 is arranged in the region on the outer side of the first arc 110 and the second arc 111 respectively with the length of the short side 122 as a radius. Therefore, as the pitch P1 and the pitch P2, at least length corresponding to a difference between the length of the short side 122 of the semiconductor device 101 and size (width) of the source pad 108 and the gate pad 109 can be secured. Further, the drain pad 107 is formed into the triangle having the pair of tangent lines respectively running from the intersection point 112 between the first arc 110 and the second arc 111 to the first arc 110 and the second arc 111, the tangent lines serving as two sides of the triangle. Thereby, while downsizing the semiconductor device 101, a sufficient bonding area for the drain pad 107 can be secured. Therefore, a decrease in fixing strength at the time of installation of the semiconductor device 101 can be suppressed.

Regarding securing of the fixing strength at the time of installation of the semiconductor device 101, the source pad 108 and the gate pad 109 are further respectively formed into a fan shape concentric to the first arc 110 and the second arc 111. Thereby, while securing the length of 0.2 mm as the pitch P1 and the pitch P2, a sufficient bonding area for the source pad 108 and the gate pad 109 can be secured.

According to the semiconductor device 101, while sufficiently securing the pitches between the adjacent pads and the bonding area for the pads, an installation area can be reduced by about 40% in comparison to the semiconductor device 200 of the comparative mode.

Next, with reference to FIGS. 19 to 25, an internal structure of the semiconductor device 101 will be described.

Figure 19:
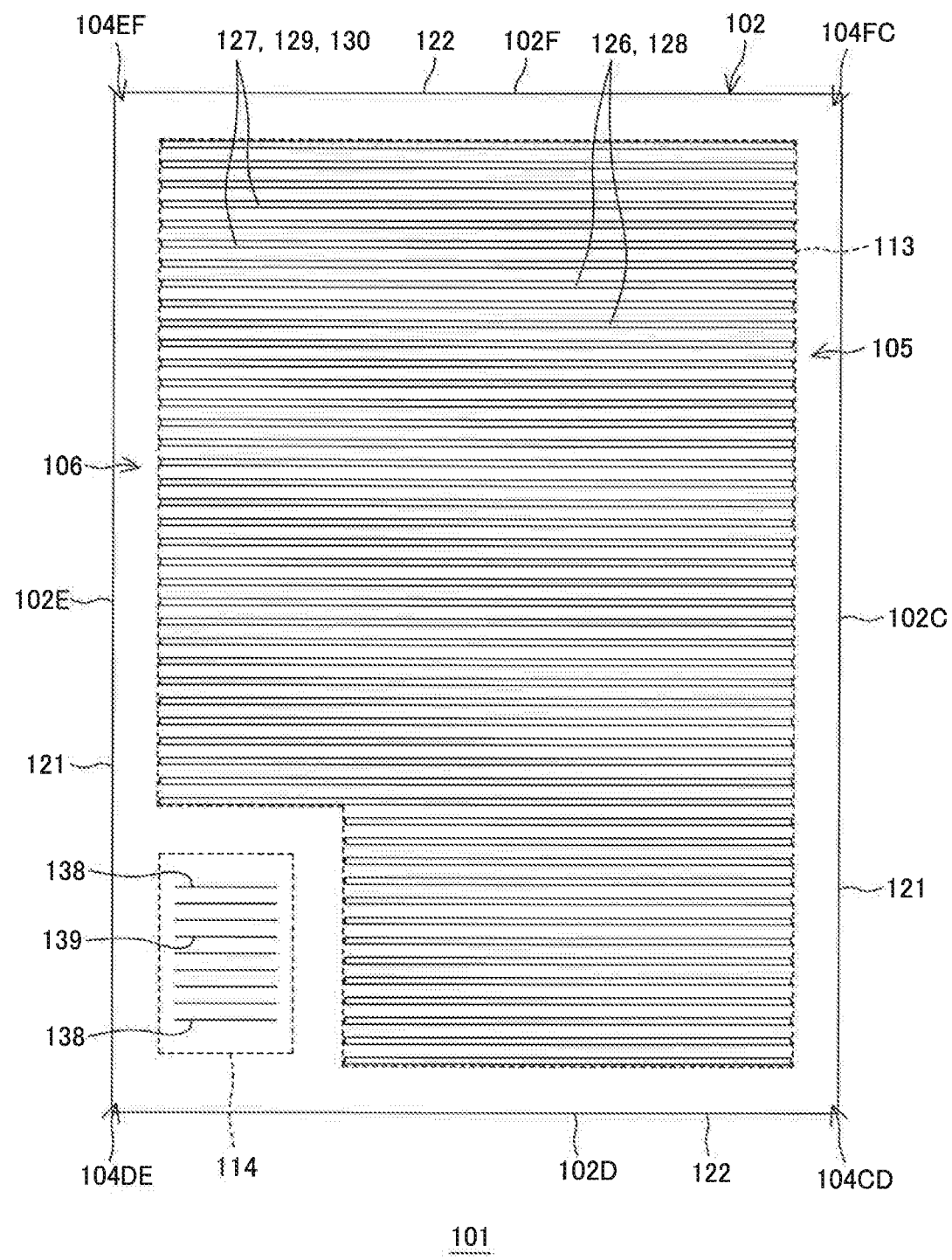
FIG. 19 is a view showing an internal structure of the semiconductor device, mainly showing a layout of an active region.
Figure 20:
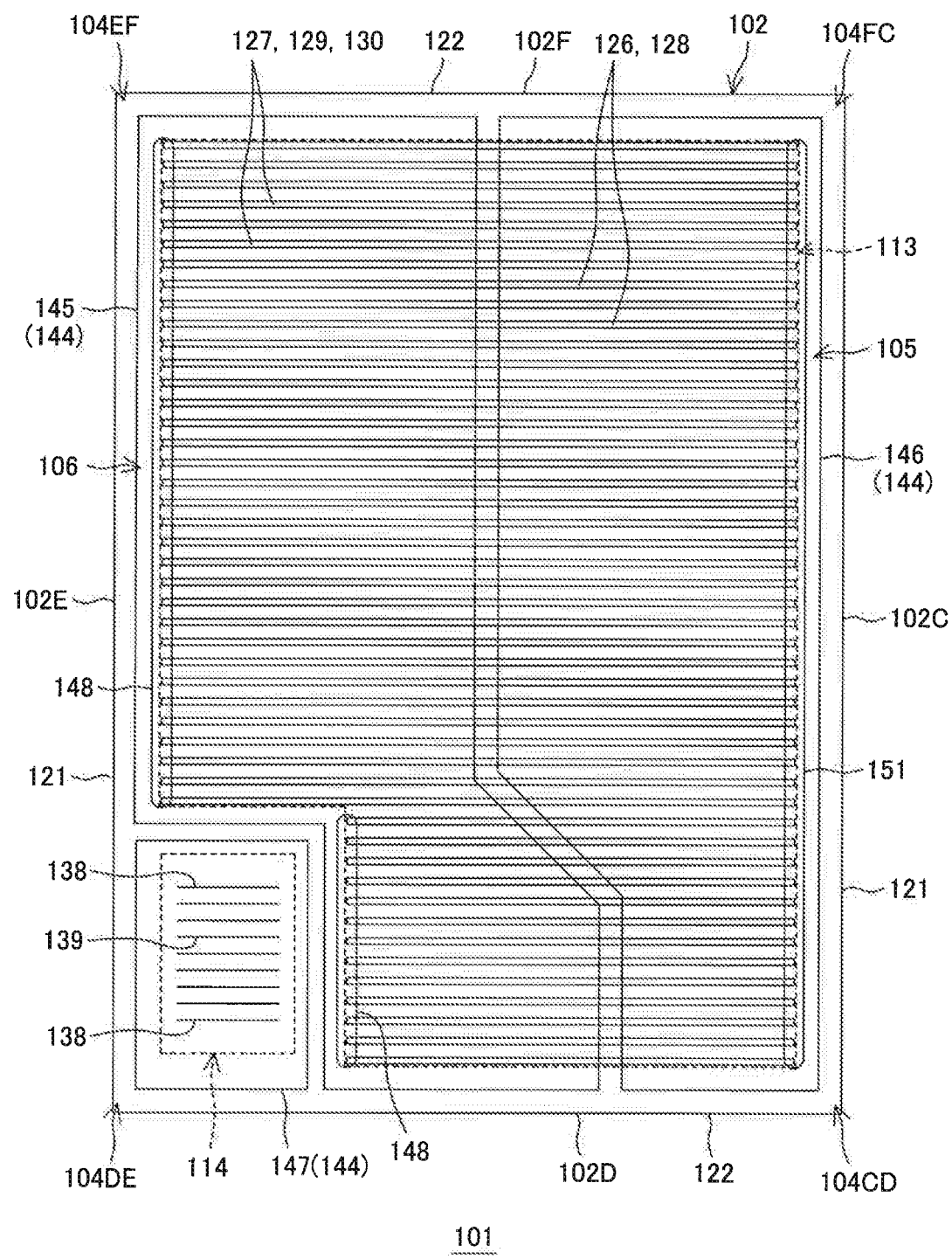
FIG. 20 is a view showing the internal structure of the semiconductor device, mainly showing a layout of a first wiring layer.
Figure 21:
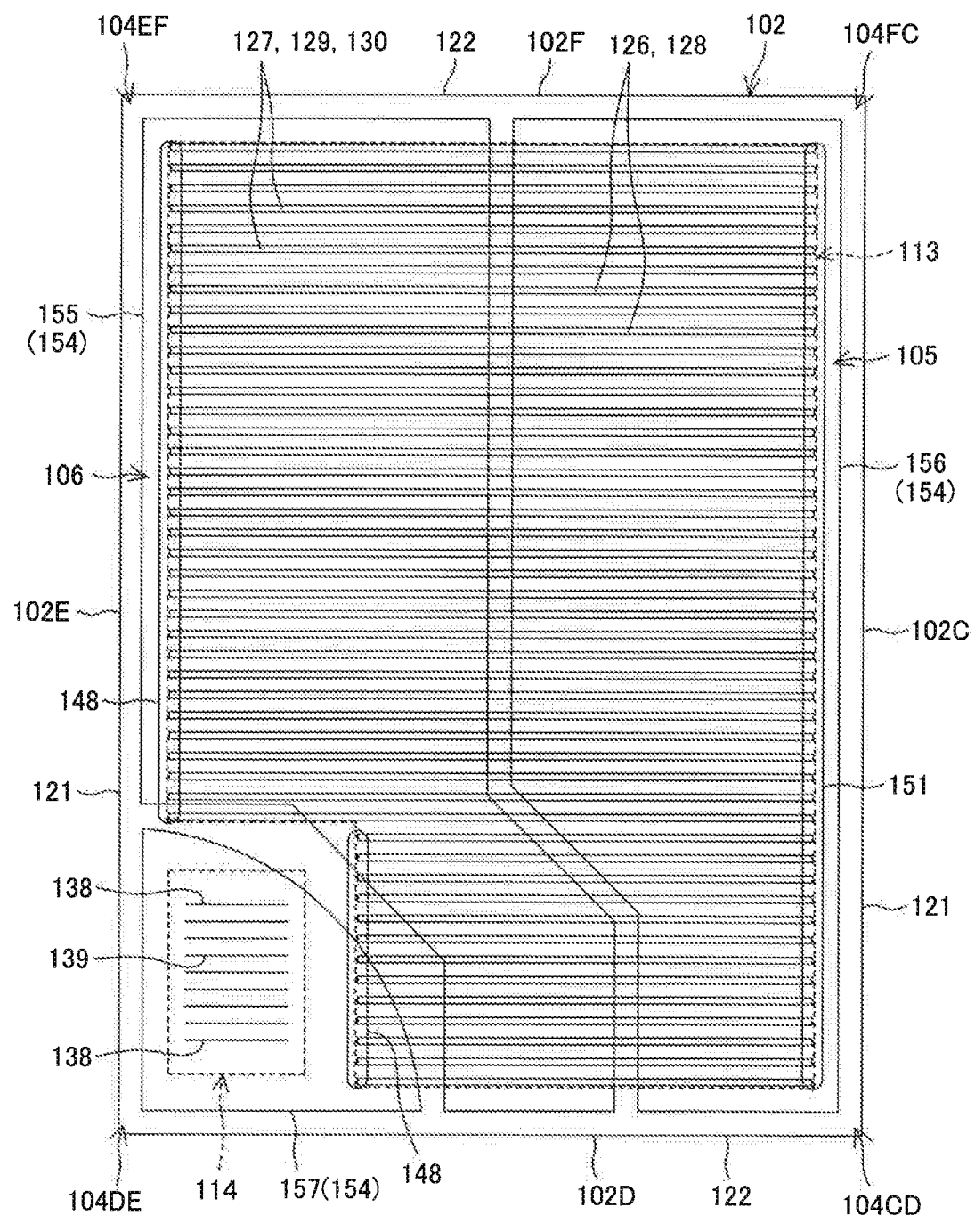
FIG. 21 is a view showing the internal structure of the semiconductor device, mainly showing a layout of a top wiring layer.
Figure 22:
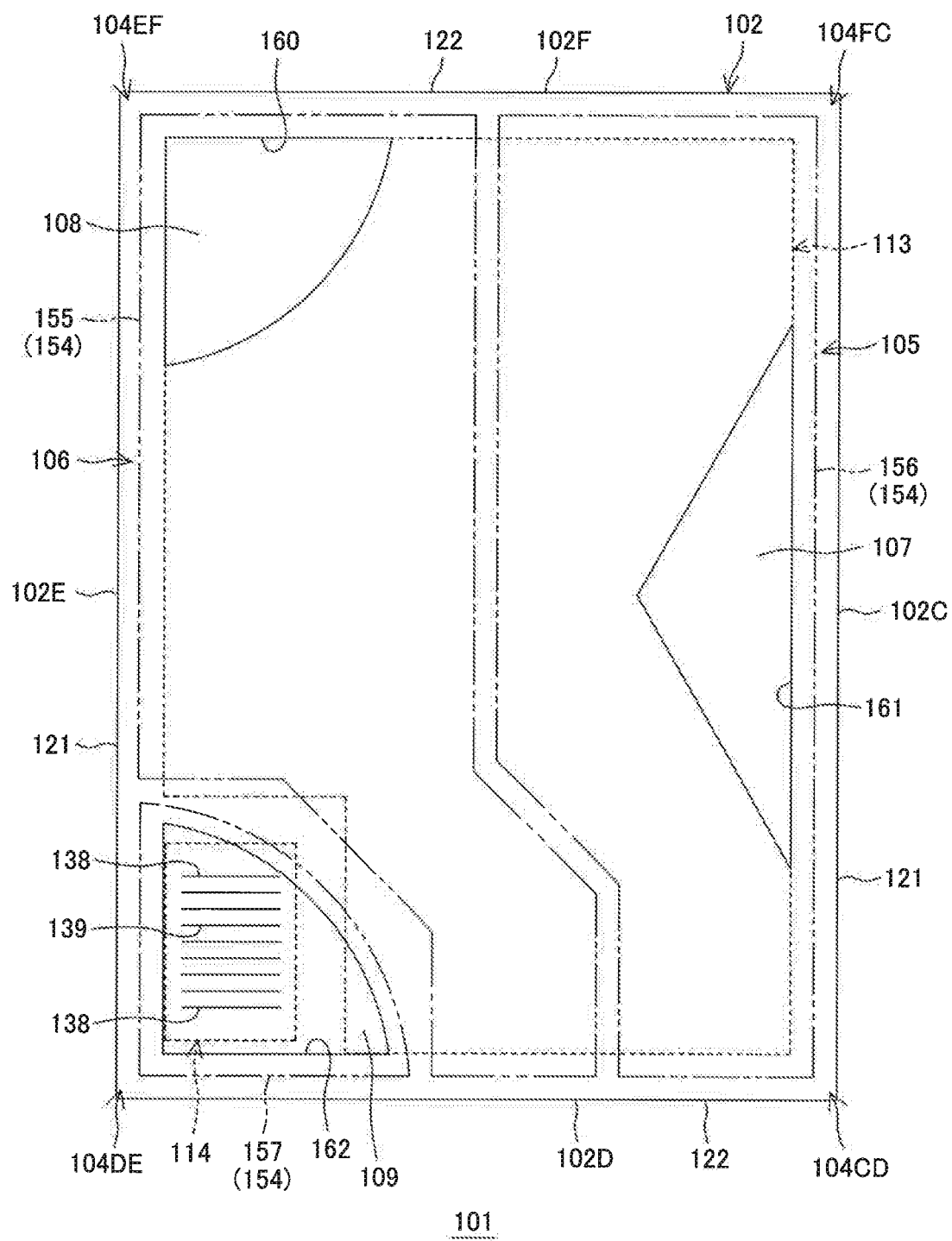
FIG. 22 is a view showing a surface structure of the semiconductor device, mainly showing a layout of pad openings.
Figure 23:
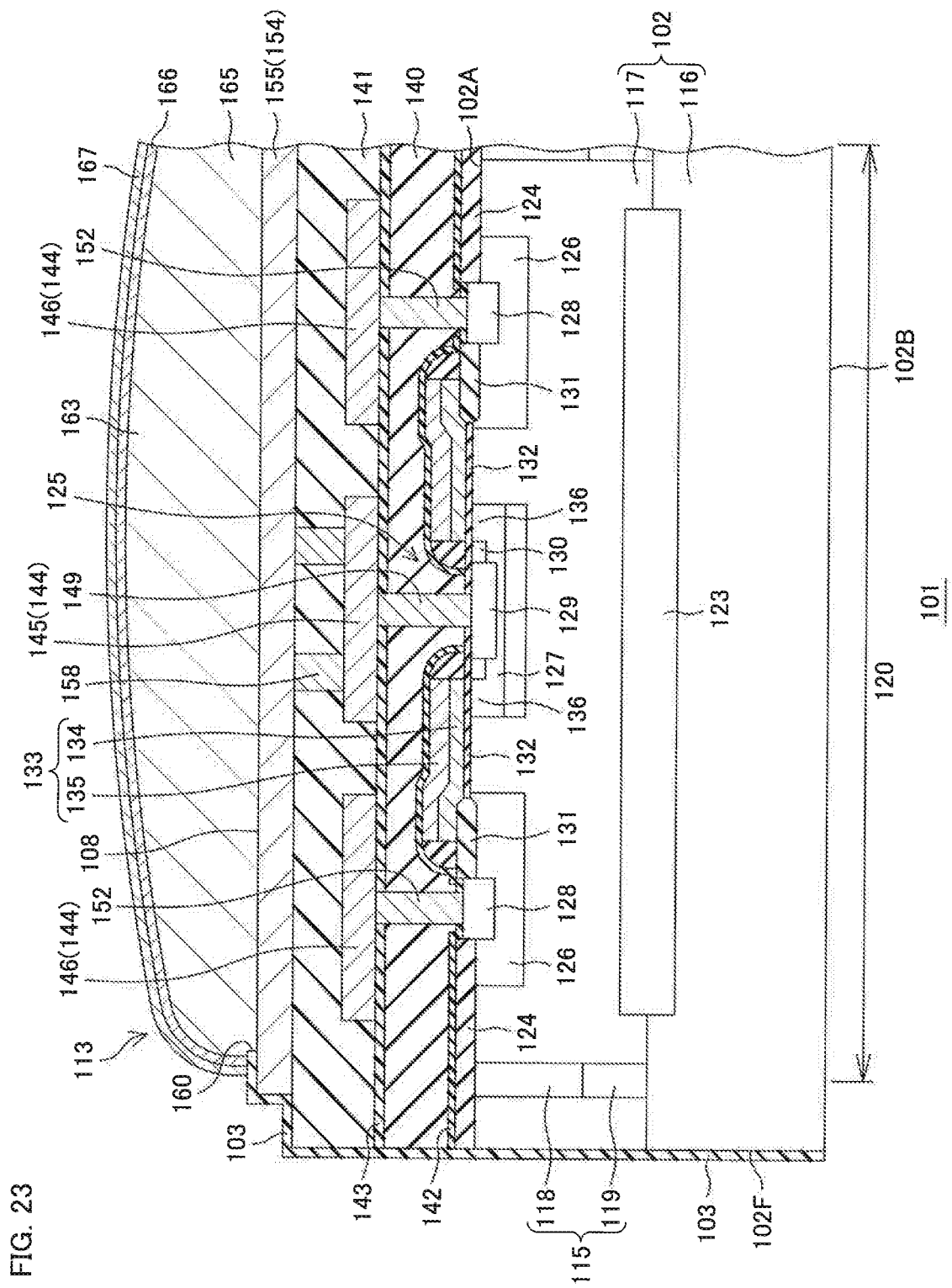
FIG. 23 is a schematic cross-sectional view of the semiconductor device, showing a section (source side section) of the active region.
Figure 24:
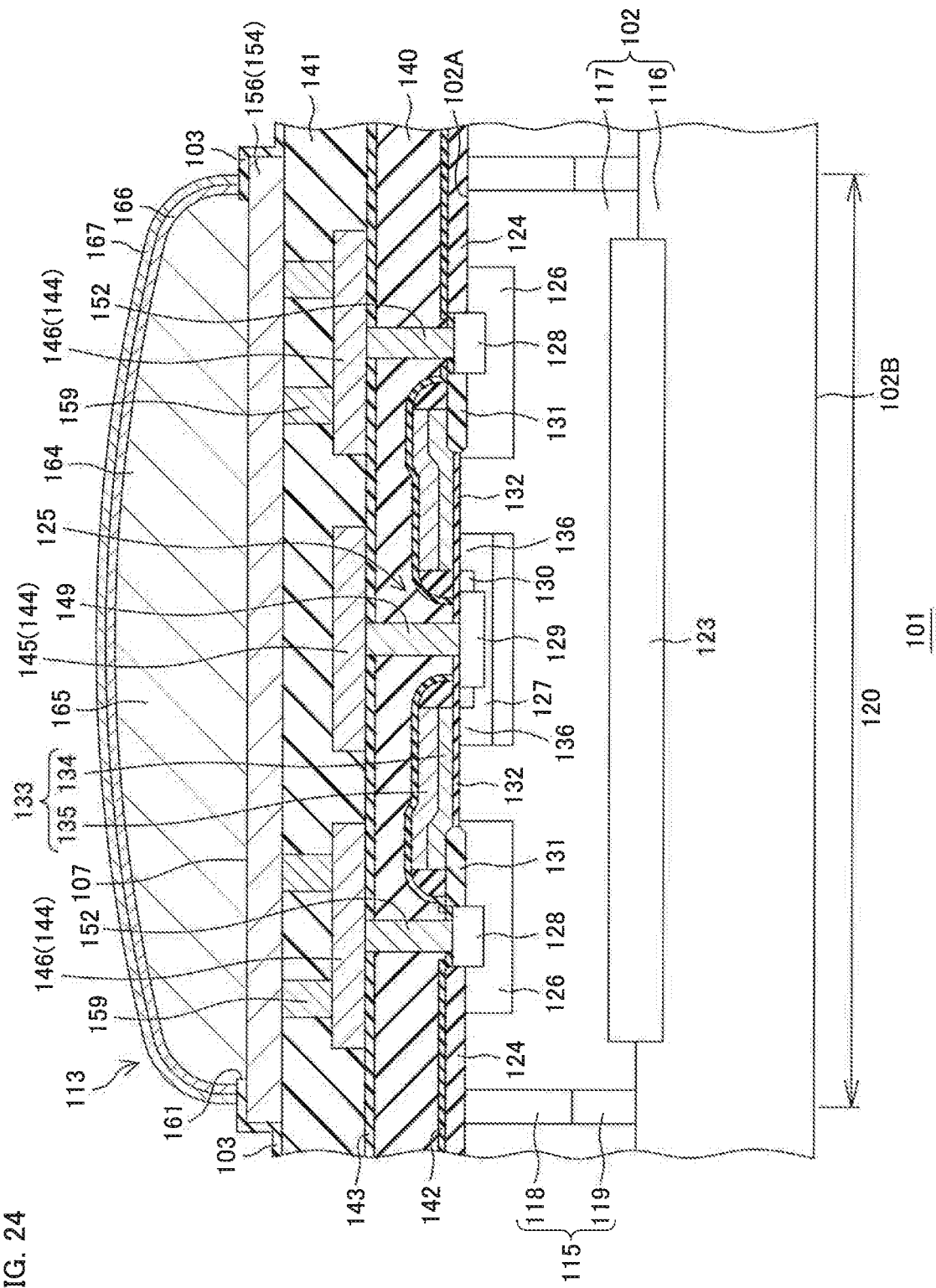
FIG. 24 is a schematic cross-sectional view of the semiconductor device, showing a section (drain side section) of the active region.
Figure 25:
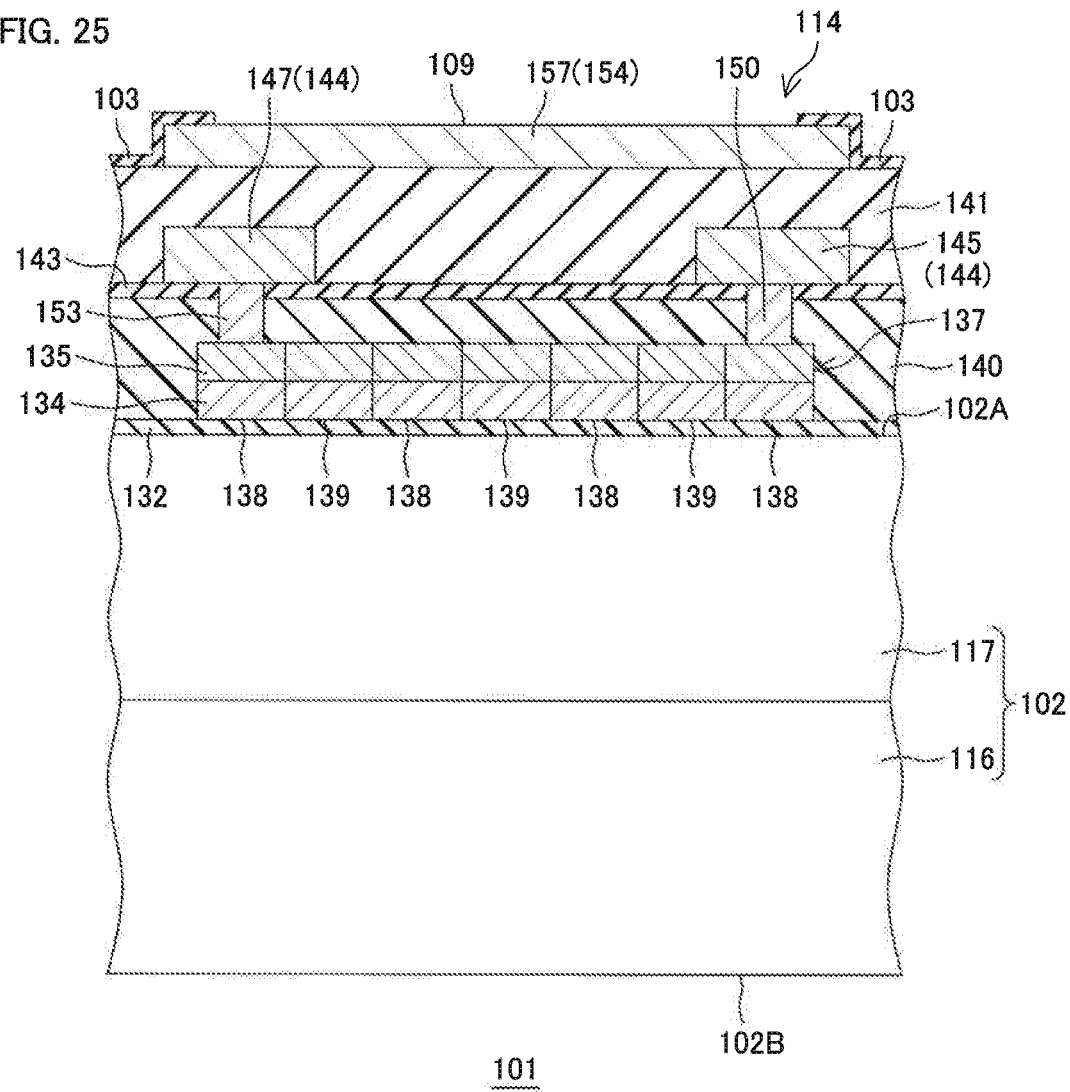
FIG. 25 is a schematic cross-sectional view of the semiconductor device, showing a section of a protection diode region.

FIGS. 19 to 21 are views showing the internal structure of the semiconductor device 101. FIG. 19 mainly shows a layout of an active region 113, FIG. 20 mainly shows a layout of a first wiring layer 144, and FIG. 21 mainly shows a layout of a top wiring layer 154. FIG. 22 is a view showing a surface structure of the semiconductor device 101, mainly showing a layout of pad openings 160 to 162. FIGS. 23 and 24 are schematic cross-sectional views of the semiconductor device 101. FIG. 23 shows a source side section of the active region 113, and FIG. 24 shows a drain side section of the active region 113. FIG. 25 is a schematic cross-sectional view of the semiconductor device 101, showing a section of a protection diode region 114. FIGS. 23 to 25 do not show sections of specific portions of FIGS. 19 and 21 but selectively show constituent elements required for illustrating the internal structure of the semiconductor device 101.

As described above, the semiconductor device 101 has the semiconductor substrate 102. The active region 113 and the protection diode region 114 are set in the semiconductor substrate 102. In the preferred embodiment, as shown in FIG. 19, for example, the protection diode region 114 of a square shape in a plan view is formed in the one corner portion 104DE of the semiconductor substrate 102. The active region 113 is formed at substantially the entire surface region of the semiconductor substrate 102 excluding the corner portion 104DE, at a fixed interval from the protection diode region 114.

As shown in FIGS. 23 and 24, the semiconductor substrate 102 includes a separation well 115 in a surface portion of the semiconductor substrate, the separation well in which part of the active region 113 is separated from the other portions as an electrically floating region. More specifically, the semiconductor substrate 102 includes a p type silicon substrate 116 and a n− type epitaxial layer 117 formed on the p type silicon substrate 116. The p type separation well 115 is formed into a band shape drawing a closed curve in a plan view, and runs from a surface 102A of the n− type epitaxial layer 117 and reaches the p type silicon substrate 116. Thickness of the n− type epitaxial layer 117 is, for example, 5.0 μm to 10 μm.

The separation well 115 is formed by a double layer structure of a p+ type well region 118 arranged on the upper side and a p− type low isolation (L/I) region 119 arranged on the lower side. A border between these regions 118, 119 is set in an intermediate portion in the thickness direction of the n− type epitaxial layer 117. For example, the border between the regions 118, 119 is set at a position of depth 1.0 µm to 2.0 µm from the surface 102A of the n− type epitaxial layer 117.

Thereby, in the semiconductor substrate 102, an element region 120 formed by part of the n− type epitaxial layer 117 which is surrounded by the separation well 115 on the p type silicon substrate 116 is partitioned.

An n+ type embedded layer (B/L) 123 is selectively formed in the element region 120. The n+ type embedded layer 123 is formed to stretch over a border between the p type silicon substrate 116 and the n− type epitaxial layer 117. Film thickness of the n+ type embedded layer 123 is, for example, 2.0 µm to 3.0 µm.

A field insulation film 124 is formed on a surface of the separation well 115. The field insulation film 124 is, for example, a LOCOS film formed by selectively oxidizing a surface of the n− type epitaxial layer 117.

A DMOSFET (double-diffused MOSFET) 125 is formed in the element region 120. The DMOSFET 125 includes n− type well regions 126 and p− type well regions 127 spaced from each other on the surface of the n− type epitaxial layer 117. The n− type well regions 126 and the p− type well regions 127 are alternately arranged and formed into a stripe shape extending in the short side direction running from the first peripheral edge portion 105 to the second peripheral edge portion 106 of the semiconductor substrate 102 as shown in plan views of FIGS. 19 to 22. In FIGS. 19 to 22, for clarification, in addition to the n− type well regions 126 and the p− type well regions 127, n+ type drain regions 128 (to be described later), n+ type source regions 129 (to be described later), and n− type impurity regions 130 (to be described later) of a stripe shape formed in regions inside these regions 126, 127 are collectively shown.

The n+ type drain region 128 having higher impurity concentration than the n− type well region 126 is formed on a surface of the n− type well region 126. The n+ type source region 129 is formed on a surface of the p− type well region 127, and the n− type impurity region 130 is formed to surround the n+ type source region 129.

An outer peripheral edge of the n+ type source region 129 is arranged at a position at a fixed interval from an outer peripheral edge of the p− type well region 127 to the inner side.

On the surface of the n− type epitaxial layer 117, a field insulation film 131 is formed in a portion between the n− type well region 126 and the p− type well region 127. The field insulation film 131 is a LOCOS film formed in the same process as the field insulation film 124 described above.

One peripheral edge of the field insulation film 131 is arranged on a peripheral edge of the n+ type drain region 128, and the other peripheral edge of the field insulation film 131 is arranged on the n− type well region 126 at a fixed interval from an outer peripheral edge of the n− type well region 126 to the inner side. The n+ type drain region 128 is formed in a region sandwiched between the peripheral edge of the field insulation film 131 and the field insulation film 124.

On the surface of the n− type epitaxial layer 117, a gate insulation film 132 is formed to stretch over the n− type epitaxial layer 117 and the p− type well region 127. A gate electrode 133 is formed via the gate insulation film 132. The gate electrode 133 is formed to selectively cover part of the gate insulation film 132 and part of the field insulation film 131.

The gate electrode 133 may be formed by, for example, a lower layer film 134 containing Poly-Si (polysilicon) and an upper layer film 135 containing WSi/Si (tungsten silicide/silicon). The gate insulation film 132 may be, for example, oxide silicon ($SiO_2$) formed by oxidizing the surface of the n− type epitaxial layer 117.

A region where the gate electrode 133 faces the p− type well region 127 via the gate insulation film 132 is a channel region 136 of the DMOSFET 125. Formation of a channel of the channel region 136 is controlled by the gate electrode 133.

Meanwhile, as shown in FIG. 25, in the protection diode region 114, a protection diode 137 is formed on the gate insulation film 132. The protection diode 137 includes p type portions 138 and n type portions 139. The p type portions 138 and the n type portions 139 are alternately arranged and formed into a stripe shape extending in the short side direction running from the first peripheral edge portion 105 to the second peripheral edge portion 106 of the semiconductor substrate 102 as shown in the plan views of FIGS. 19 to 22. The p type portion 138 is arranged in any of both ends of the stripe pattern. The protection diode 137 is formed by the pair of p type portion 138 and n type portion 139 adjacent to each other. The protection diode 137 may have a double layer structure of the lower layer film 134 and the upper layer film 135 as well as the gate electrode 133.

A first interlayer film 140 and a second interlayer film 141 are formed to cover the entire surface region of the semiconductor substrate 102. The first interlayer film 140 and the second interlayer film 141 are made of, for example, an insulating material such as oxide silicon ($SiO_2$). In the preferred embodiment, the first interlayer film 140 and the second interlayer film 141 are formed. However, further, third, fourth, or further interlayer films may be formed as an upper layer film of the second interlayer film 141. Etching-stop films 142, 143 made of, for example, silicon nitride (SiN) may be placed between the first interlayer film 140 and the semiconductor substrate 102, and between the second interlayer film 141 and the first interlayer film 140, respectively. The etching-stop film 142 may be formed on the field insulation films 124, 131.

A first wiring layer 144 is formed on the first interlayer film 140. The first wiring layer 144 includes a source first metal 145, a drain first metal 146, and a gate first metal 147. These are made of a metal layer of AlCu, etc., or a barrier layer (of Ti, TiN, etc.) may be formed on a surface or a back surface as needed.

As shown in FIG. 20, the source first metal 145 is formed to cover a substantially half region of the active region 113 on the side of the second peripheral edge portion 106. Specifically, the source first metal 145 is formed on the side of the side surface 102F in the longitudinal direction and on the side of the side surface 102C in the width direction with respect to the protection diode region 114 in order to avoid the protection diode region 114. Therefore, in a plan view, inner two sides of the protection diode region 114 of a substantially square shape are adjacent to the source first metal 145. The source first metal 145 is connected to the n+ type source region 129 via a plug (for example, a tungsten plug) 149 in a source side end portion region 148 on the side of the second peripheral edge portion 106 of the n+ type drain regions 128 and the n+ type source regions 129 of a stripe shape. As shown in FIG. 25, the source first metal 145 is connected to the p type portion 138 arranged in the one end portion of the protection diode 137 via a plug (for example, a tungsten plug) 150.

As shown in FIG. 20, the drain first metal 146 is formed to cover a substantially half region of the active region 113 on the side of the first peripheral edge portion 105. The drain first metal 146 is connected to the n+ type drain region 128 via a plug (for example, a tungsten plug) 152 in a drain side end portion region 151 on the side of the first peripheral edge portion 105 of the n+ type drain regions 128 and the n+ type source regions 129 of a stripe shape.

As shown in FIG. 25, the gate first metal 147 is connected to the p type portion 138 arranged in the other end portion of the protection diode 137 via a plug (for example, a tungsten plug) 153. The gate first metal 147 is connected to the gate electrode 133 at a position (not shown).

A top wiring layer 154 is formed on the second interlayer film 141. In the preferred embodiment, since the second interlayer film 141 is the uppermost interlayer film, the layer is called the top wiring layer 154. However, in a case where a third interlayer film, etc., is further formed on the second interlayer film 141, the wiring layer of the second interlayer film 141 may be called a second wiring layer.

The top wiring layer 154 includes a source top metal 155, a drain top metal 156, and a gate top metal 157. These are made of a metal layer of AlCu, etc., or a barrier layer (of Ti, TiN, etc.) may be formed on a surface or a back surface as needed.

As shown in FIG. 21, the gate top metal 157 is formed into a fan shape in a plan view, which is a shape similar to and larger than the gate pad 109. Part of the gate top metal 157 overlaps the source side end portion region 148 on the side of the side surface 102C with respect to the protection diode 137 and the protection diode region 114. The gate top metal 157 is connected to the gate first metal 147 at a position (not shown).

As shown in FIG. 21, the source top metal 155 is formed to cover substantially the half region of the active region 113 on the side of the second peripheral edge portion 106. Specifically, the source top metal 155 is formed on the side of the side surface 102F in the longitudinal direction and on the side of the side surface 102C in the width direction with respect to the gate top metal 157 in order to avoid the gate top metal 157. Therefore, an arc portion of the gate top metal 157 of a fan shape in a plan view is adjacent to the source top metal 155. As shown in FIG. 23, the source top metal 155 is connected to the source first metal 145 via a plug (for example, a tungsten plug) 158.

As shown in FIG. 21, the drain top metal 156 is formed to cover substantially the half region of the active region 113 on the side of the first peripheral edge portion 105. The drain top metal 156 is connected to the drain first metal 146 via a plug (for example, a tungsten plug) 159 as shown in FIG. 24.

The surface insulation film 103 is formed on the second interlayer film 141 to cover the top wiring layer 154. The surface insulation film 103 covers the side of the surface 102A of the semiconductor substrate 102 and also covers the side surfaces 102C to 102F of the semiconductor substrate 102 (see FIG. 23). The surface insulation film 103 may be made of, for example, silicon nitride (SiN).

The pad openings 160 to 162 to expose part of the source top metal 155, the drain top metal 156, and the gate top metal 157 respectively as the source pad 108, the drain pad 107, and the gate pad 109 are formed in the surface protection film 103.

As shown in FIG. 23, a source terminal 163 (bump) is formed in the source pad 108. As shown in FIG. 24, a drain terminal 164 (bump) is formed in the drain pad 107. Although not shown, a gate terminal (bump) is also formed in the gate pad 109. These terminals may have, for example, a laminated structure of a Ni layer 165, a Pd layer 166, and an Au layer 167 laminated by a plating method. By providing the Au layer 167 on the outermost surface, a highly reliable terminal (electrode) excellent in corrosion resistance and solder wettability can be provided.

As described above, with the semiconductor device 101, the source first metal 145, the source top metal 155, the drain first metal 146, and the drain top metal 156 are respectively formed at a size to cover substantially the half region of the active region 113. Thereby, a large current pathway between the source and the drain can be secured. Therefore, while downsizing the semiconductor device 101, the increase in the on-resistance of the MIS transistor can be suppressed. Further, the semiconductor device 101 has the WL-CSP package structure, which is a wireless structure in which no bonding wires are used for any of the electric connections inside the package. Thereby, wire resistance can also be reduced. Thus, the on-resistance per package size can be decreased to a great extent.

Although the semiconductor device 101 has the WL-CSP package structure, the side surfaces 102C to 102F of the semiconductor substrate 102 are covered with the surface insulation film 103. Therefore, in a case where the semiconductor devices 101 are highly densely packed, a short circuit with an adjacent semiconductor device can be prevented.

Next, with reference to FIGS. 26A to 26F, manufacturing processes of the semiconductor device 101 will be described. FIGS. 26A to 26F are cross-sectional views for illustrating one example of the manufacturing processes of the semiconductor device 101. FIGS. 26A to 26F respectively correspond to FIG. 23.

Figure 26A:
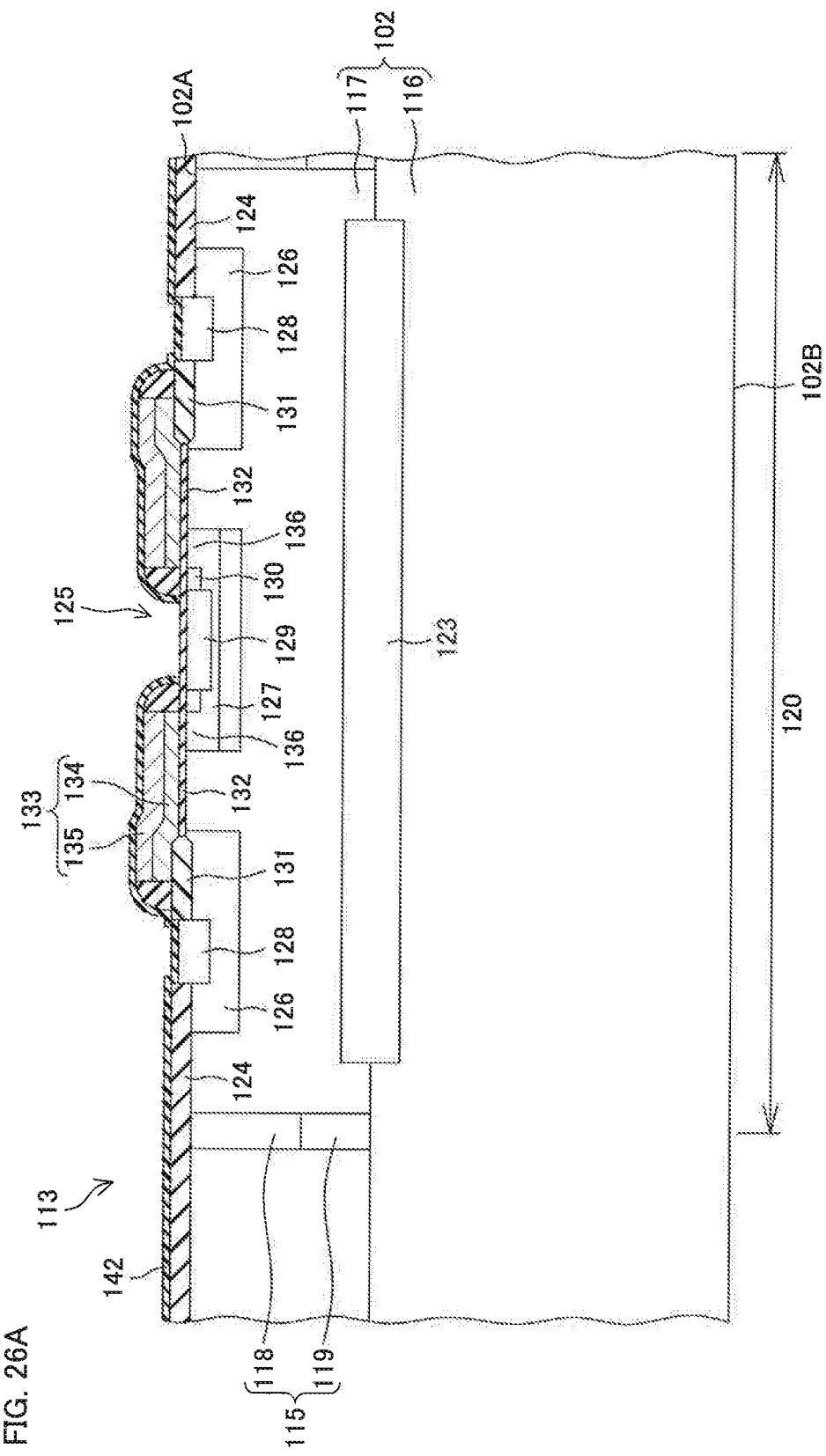

In order to manufacture the semiconductor device 101, the p type silicon substrate 116 in a wafer state is prepared. Next, n type impurities and p type impurities are selectively charged into a surface of the p type silicon substrate 116. While adding the n type impurities at a temperature of, for example, 1,100° C. or more, epitaxial growth of silicon of the p type silicon substrate 116 is performed. Thereby, as shown in FIG. 26A, the semiconductor substrate 102 (wafer) including the p type silicon substrate 116 and the n− type epitaxial layer 117 is formed.

At the time of epitaxial growth of the p type silicon substrate 116, the n type impurities and the p type impurities charged into the p type silicon substrate 116 are diffused in the growth direction of the n− type epitaxial layer 117. Thereby, the n+ type embedded layer 123 stretching over the border between the p type silicon substrate 116 and the n− type epitaxial layer 117, and the p− type low isolation region 119 are formed. The p type impurities include, for example, boron (B), aluminum (Al), etc., and the n type impurities include, for example, phosphorus (P), arsenic (As), etc.

Next, an ion charging mask (not shown) selectively having an opening in a portion where the p+ type well region 118 has to be formed is formed on the n− type epitaxial layer 117. The p type impurities are charged into the n− type epitaxial layer 117 via the ion charging mask. Thereby, the separation well 115 formed by the double layer structure of the p+ type well region 118 and the p− type low isolation region 119 is formed. After the separation well 115 is formed, the ion charging mask is removed.

Next, a hard mask (not shown) selectively having an opening in a portion where the field insulation films 124, 131 have to be formed is formed on the n− type epitaxial layer 117. Thermal oxidation is performed onto the surface of the n− type epitaxial layer 117 via the hard mask, so that the field insulation films 124, 131 of the LOCOS films are formed. After that, the hard mask is removed.

Next, thermal oxidation is performed onto the surface of the n− type epitaxial layer 117, so that the gate insulation film 132 is formed. At this time, the gate insulation film 132 is formed to continue to the field insulation films 124, 131. Next, a material for the gate electrode 133 is selectively formed on the n− type epitaxial layer 117, so that the gate electrode 133 and the protection diode 137 (not shown) are formed.

Next, the n− type well region 126 and the p− type well region 127 are formed. In order to form the n− type well region 126, first, an ion charging mask (not shown) selectively having an opening in a portion where the n− type well region 126 has to be formed is formed. Then, the n type impurities are charged into the n− type epitaxial layer 117 via the ion charging mask. Thereby, the n− type well region 126 is formed. After the n− type well region 126 is formed, the ion charging mask is removed. By similar procedures, an ion charging mask (not shown) selectively having an opening in a portion where the p− type well region 127 has to be formed is formed. The p type impurities are charged into the n− type epitaxial layer 117 via the ion charging mask. Thereby, the p− type well region 127 is formed. After the p− type well region 127 is formed, the ion charging mask is removed.

Next, the n− type impurity region 130 is formed in the region inside the p− type well region 127. In order to form the n− type impurity region 130, first, an ion charging mask (not shown) selectively having an opening in a portion where the n− type impurity region 130 has to be formed is formed. Then, the n type impurities are charged into the p− type well region 127 via the ion charging mask. Thereby, the n− type impurity region 130 is formed in the region inside the p− type well region 127. After the n− type impurity region 130 is formed, the ion charging mask is removed.

Next, the n+ type drain region 128 and the n+ type source region 129 are respectively selectively formed in the region inside the n− type well region 126 and in the region inside the p− type well region 127. In order to form the n+ type drain region 128 and the n+ type source region 129, first, an ion charging mask (not shown) selectively having openings in portions where the n+ type drain region 128 and the n+ type source region 129 have to be formed is formed. The n type impurities are charged into the n− type well region 126 and the p− type well region 127 via the ion charging mask. Thereby, the n+ type drain region 128 and the n+ type source region 129 are formed. After the n+ type drain region 128 and the n+ type source region 129 are formed, the ion charging mask is removed.

Next, as shown in FIG. 26B, an insulating material is disposed to cover the gate electrode 133, so that the first interlayer film 140 is formed. Next, the plugs 149, 150, 152, 153 are formed to pass through the first interlayer film 140. Next, after the etching-stop film 143 is formed, the source first metal 145, the drain first metal 146, and the gate first metal 147 are selectively formed on the first interlayer film 140.

Next, as shown in FIG. 26C, an insulating material is disposed to cover the source first metal 145, the drain first metal 146, and the gate first metal 147, so that the second interlayer film 141 is formed. Next, the plugs 158, 159 are formed to pass through the second interlayer film 141. Next, the source top metal 155, the drain top metal 156, and the gate top metal 157 are selectively formed on the second interlayer film 141.

Next, an insulating material is disposed to cover the source top metal 155, the drain top metal 156, and the gate top metal 157, so that the surface insulation film 103 is formed. After that, by selectively removing the surface insulation film 103, the pad openings 160 to 162 are formed.

Figure 26D:
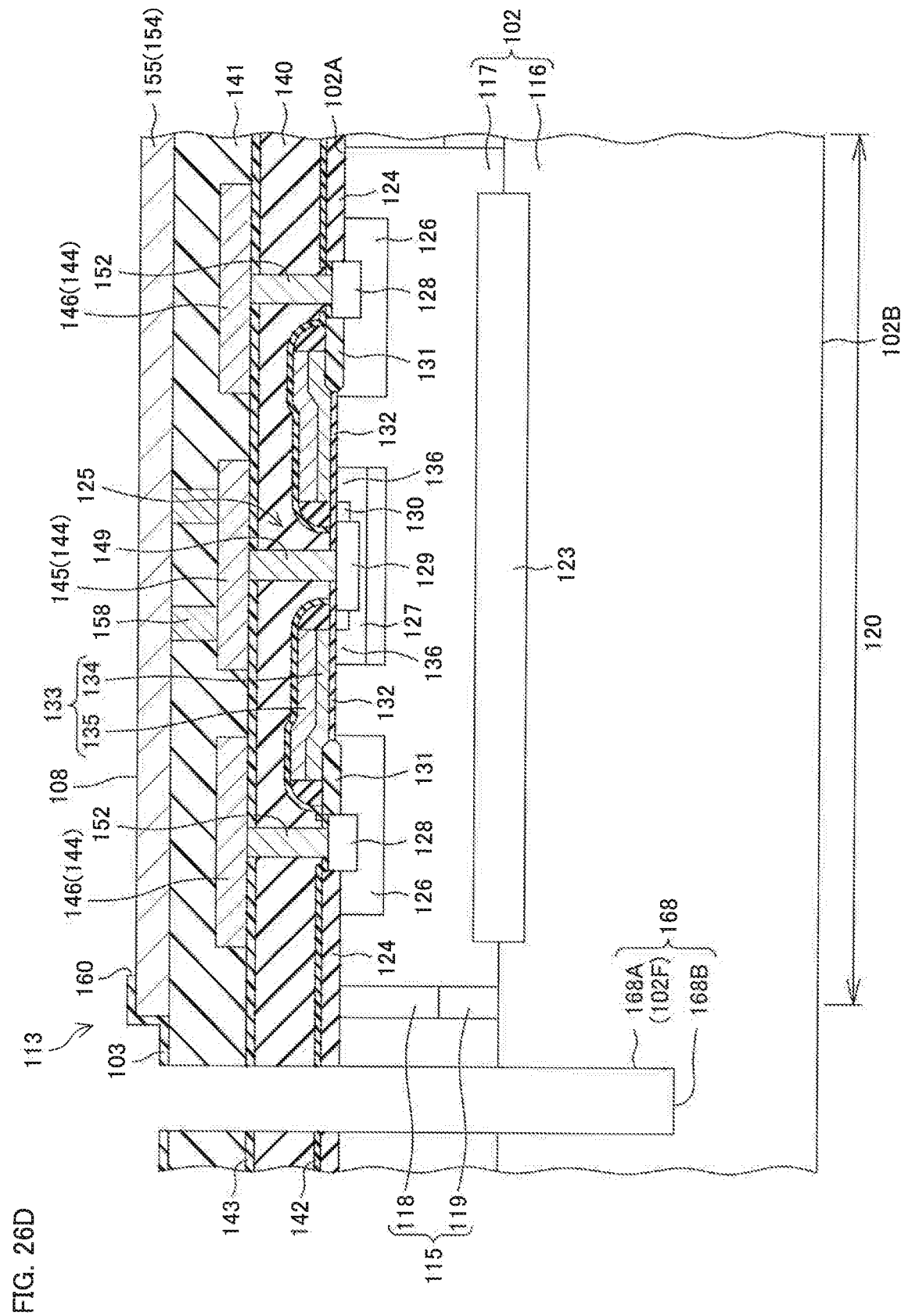

Next, as shown in FIG. 26D, the semiconductor substrate 102 is selectively removed along a preliminarily set element border line by, for example, plasma etching. Thereby, a groove 168 having predetermined depth, the groove running from the surface 102A of the semiconductor substrate 102 to the middle of thickness of the semiconductor substrate 102 is formed between the adjacent transistor regions. The groove 168 is partitioned by a pair of side walls 168A facing each other, and a bottom wall 168B connecting lower ends of the pair of the side walls 168A (ends on the side of the back surface 102B of the semiconductor substrate 102).

Figure 26E:
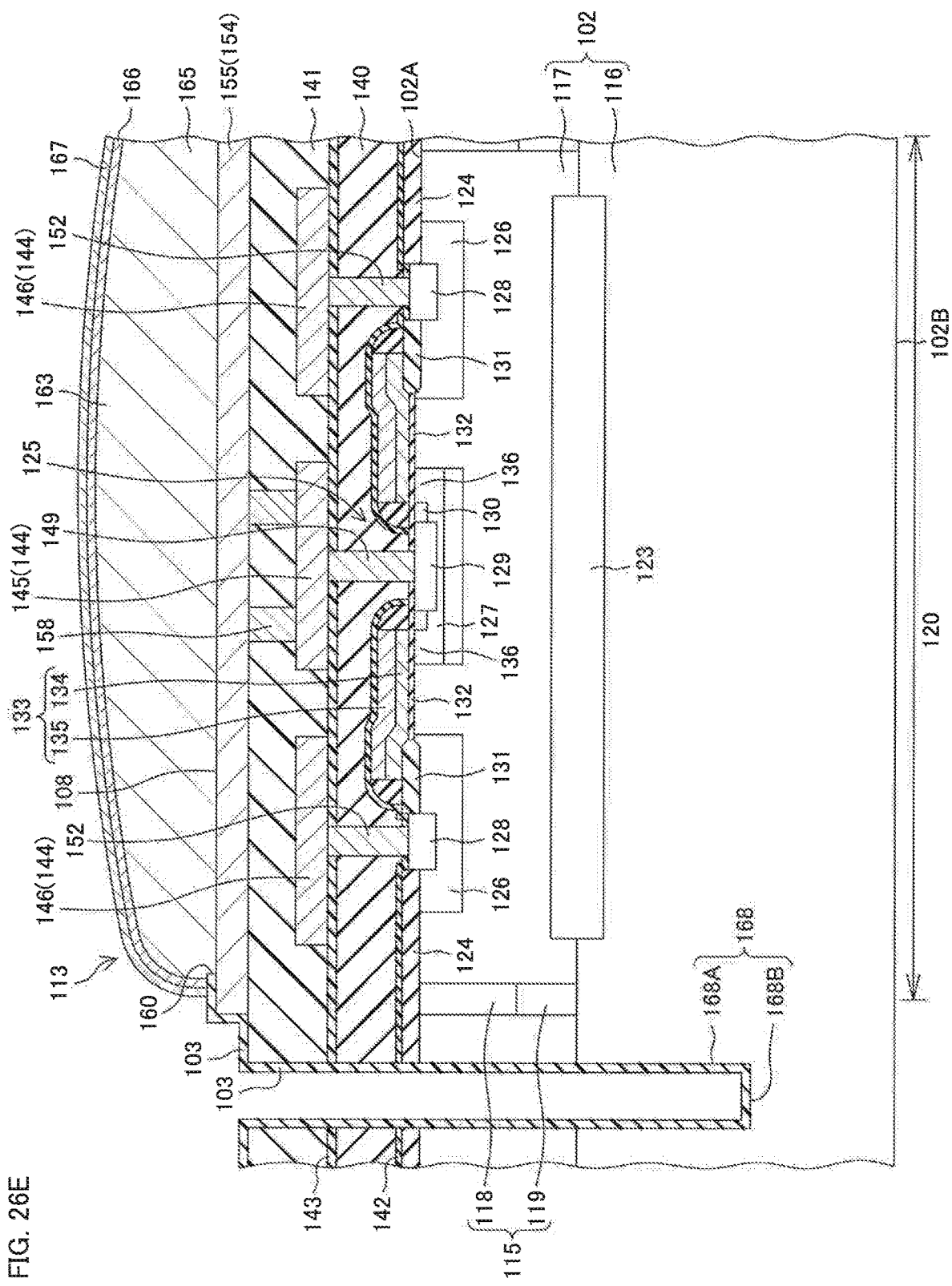

Next, as shown in FIG. 26E, an insulation film made of SiN is formed over the entire region on the side of the surface 102A of the semiconductor substrate 102 by the CVD method. At this time, the insulation film is also formed on the entire region of an inner peripheral surface of the groove 168 (the side walls 168A and the bottom wall 168B described above). Thereby, the portion of the surface insulation film 103 to cover the side surfaces 102C to 102F is formed.

Next, plating growth is performed in order of Ni, Pd, and Au from the source pad 108, the drain pad 107, and the gate pad 109 exposed from the pad openings 160 to 162 by non-electrolytic plating. Thereby, as shown in FIG. 26E, the source terminal 163, the drain terminal 164 (not shown), and the gate terminal (not shown) formed by a laminated film of the Ni layer 165/Pd layer 166/Au layer 167 are formed.

Figure 26F:
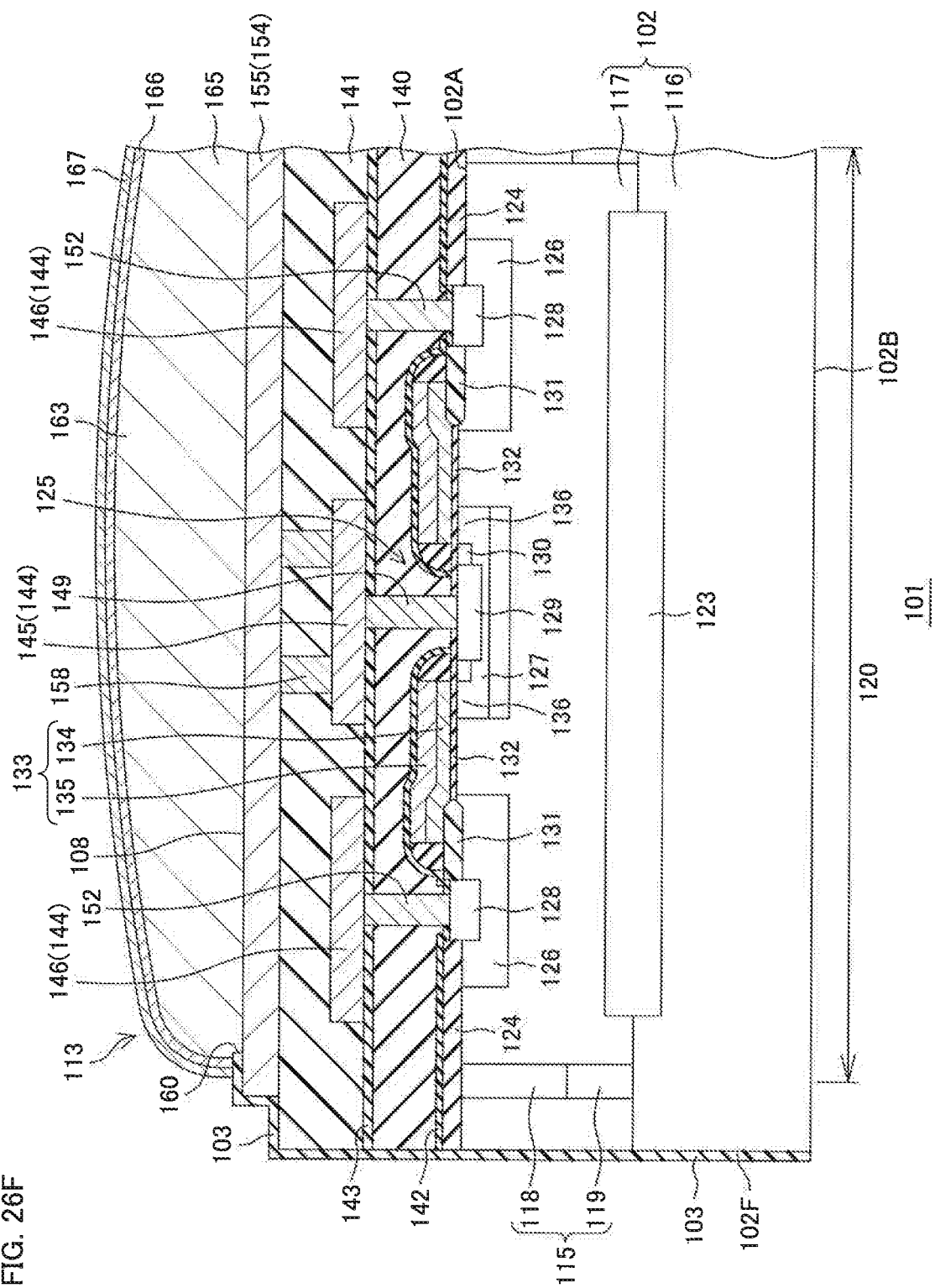

Next, a support tape (not shown) is applied on the side of the surface 102A of the semiconductor substrate 102 in a wafer state, and in that state, the semiconductor substrate 102 is ground from the side of the back surface 102B. When, by grinding, the semiconductor substrate 102 is made so thin that grinding is made up to an upper surface of the bottom wall 168B of the groove 168, there are no portions to couple adjacent partially-processed goods. Thus, the semiconductor substrate 102 is divided with the groove 168 as a border. Through the above processes, a single piece of the semiconductor device 101 is obtained as shown in FIG. 26F.

One preferred embodiment of the present invention is described above referring to FIGS. 16 to 26F. However, the present invention can also be implemented in other modes.

For example, the semiconductor substrate 102 does not have to be formed into a rectangular shape in a plan view but may be formed into other square shapes such as a regular square shape in a plan view.

The drain pad 107 may be formed into, for example, a circular shape, a semi-circular shape, etc., in a plan view. The source pad 108 and the gate pad 109 may be formed into, for example, a circular shape, a triangle, etc., in a plan view.

In the preferred embodiment described above, only the structure of MOSFET is shown as one example of the element structure of the semiconductor device 101. However, the elements built into the semiconductor device 101 may be other elements such as IGBTs, bipolar transistors, etc.

The semiconductor device of the present invention can be favorably applied to wearable devices (for example, smartphones, tablet PCs, etc.) which are applications particularly required to be downsized.

In addition, various design changes can be made within a range of the matters described in the claims.

What is claimed is:

1. A semiconductor device comprising:
a semiconductor layer;
a first switching element and a second switching element commonly formed on the semiconductor layer, the first switching element and the second switching element being alternately arranged;
an interlayer insulating film formed on the semiconductor layer, the first switching element and the second switching element being covered with the interlayer insulating film;
a first output terminal formed on the interlayer insulating film, the first output terminal having a first contact portion electrically connected to the first switching element through the interlayer insulating film such that the first output terminal forms a first end portion of the first switching element;
a second output terminal formed on the interlayer insulating film, the second output terminal having a second contact portion electrically connected to the second switching element through the interlayer insulating film such that the second output terminal forms a first end portion of the second switching element; and
a gate terminal formed on the interlayer insulating film, the gate terminal being commonly electrically connected to the first switching element and the second switching element through the interlayer insulating film, the gate terminal being arranged on a center portion of a first side of the semiconductor layer such that the gate terminal is surrounded by the first contact portion and the second contact portion from three sides other than the first side of the semiconductor layer, wherein
the first contact portion and the second contact portion are alternately arranged,
the first output terminal and the second output terminal are formed into comb shapes to be engaged with each other,
the first output terminal has a plurality of first teeth portions extending in a first direction along the first side of the semiconductor layer, a first connection portion extending in a second direction perpendicular to the first direction and connecting the plurality of the first teeth portions, and a first protruding portion connected to the first connecting portion and protruding toward the gate terminal such that the first protruding portion has a first width in the second direction larger than a width of each of the first teeth portions in the second direction,
the second output terminal has a plurality of second teeth portions extending in the first direction to be engaged with the first teeth portions, a second connection portion extending in the second direction and connecting the plurality of the second teeth portions, and a second protruding portion connected to the second connection portion and protruding toward the gate terminal such that the second protruding portion has a second width in the second direction larger than a width of each of the second teeth portions in the second direction, and
the gate terminal is sandwiched between the first protruding portion and the second protruding portion.

2. The semiconductor device according to claim 1, wherein
a first side of the gate terminal is adjacent to the first contact portion in the first direction,
a second side of the gate terminal opposite to the first side of the gate terminal is adjacent to the second contact portion in the first direction.

3. The semiconductor device according to claim 1, further comprising:
linear first unit cell rows, each of which is formed by a plurality of the first switching elements, and
linear second unit cell rows, each of which is formed by a plurality of the second switching elements, wherein
the linear first unit cell rows and the linear second unit cell rows are spaced from each other and alternately arranged.

4. The semiconductor device according to claim 3, wherein each of the first teeth portions is provided on an upper side of the first unit cell rows and each of the second teeth portions is provided on an upper side of the second unit cell rows.

5. The semiconductor device according to claim 1, wherein
the first switching element includes a p-channel MISFET, and
the second switching element includes a p-channel MISFET.

6. The semiconductor device according to claim 1, wherein
a plurality of the first switching elements and a plurality of the second switching elements are arranged in a matrix as a whole, and
the plurality of the first switching elements and the plurality of the second switching elements are alternately arranged respectively in a row direction and a column direction.

7. The semiconductor device according to claim 1, wherein
the semiconductor layer has a common first conductivity type drain region for the first switching element and the second switching element,
the first switching element includes a first body region of a second conductivity type formed on a surface portion of the semiconductor layer, a first source region of the first conductivity type formed on a surface portion of the first body region, and a first gate electrode facing the first body region,
the second switching element includes a second body region of the second conductivity type formed on the surface portion of the semiconductor layer, a second source region of the first conductivity type formed on a surface portion of the second body region, and a second gate electrode facing the second body region.

8. The semiconductor device according to claim 1, wherein the semiconductor layer is formed in a square shape in a plan view having a surface, a back surface on the opposite side of the surface, and side surfaces between the surface and the back surface, and
the semiconductor device further comprises:
a surface insulation film formed on the semiconductor layer so as to cover at least the surface of the semiconductor layer;
a first pad of a part of the first output terminal arranged in a central portion of a first peripheral edge portion along one of the side surfaces of the semiconductor layer on the surface side of the semiconductor layer and spaced from both end corner portions of the first peripheral edge portion;
a second pad of a part of the second output terminal arranged in one end corner portion of a second peripheral edge portion facing the first peripheral edge portion of the semiconductor layer; and a third pad of a part of the gate terminal arranged in an other end corner portion of the second peripheral edge portion of the semiconductor layer.

9. The semiconductor device according to claim 8, wherein the semiconductor layer includes a semiconductor layer of a rectangular shape in a plan view, and the first peripheral edge portion and the second peripheral edge portion include peripheral edge portions along the longitudinal direction of the semiconductor layer.

10. The semiconductor device according to claim 9, wherein providing that a first arc with a top of the one end corner portion of the second peripheral edge portion as a center and with length of a short side of the semiconductor layer as a radius, and a second arc with a top of the other end corner portion of the second peripheral edge portion as a center and with the length of the short side of the semiconductor layer as a radius are formed on the surface of the semiconductor layer, the first pad is arranged in a region on the outer side of the first arc and in a region on the outer side of the second arc.

11. The semiconductor device according to claim 10, wherein the first arc and the second arc have such size that the arcs cross each other on the semiconductor layer, and the first pad is formed into a triangle having a pair of tangent lines running from an intersection point between the first arc and the second arc respectively to the first arc and the second arc, the tangent lines serving as two sides of the triangle.

12. The semiconductor device according to claim 10, wherein the second pad is formed into a fan shape concentric to the first arc.

13. The semiconductor device according to claim 10, wherein the third pad is formed into a fan shape concentric to the second arc.

14. A semiconductor package comprising:

the semiconductor device according to claim 1; and a sealing resin that seals the whole or part of the semiconductor device.

* * * * *